(12) United States Patent
Sugimoto

(10) Patent No.: US 11,740,522 B2
(45) Date of Patent: Aug. 29, 2023

(54) ELECTRO-OPTICAL DEVICE AND ELECTRONIC APPARATUS

(71) Applicant: SEIKO EPSON CORPORATION, Tokyo (JP)

(72) Inventor: Yohei Sugimoto, Fujimi-Machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/678,008

(22) Filed: Feb. 23, 2022

(65) Prior Publication Data

US 2022/0269140 A1    Aug. 25, 2022

(30) Foreign Application Priority Data

Feb. 25, 2021   (JP) ................................ 2021-028269

(51) Int. Cl.

| | | |
|---|---|---|
| *G02F 1/1362* | (2006.01) | |
| *G02F 1/1368* | (2006.01) | |
| *G02F 1/1343* | (2006.01) | |
| *H01L 27/12* | (2006.01) | |
| *H01L 29/786* | (2006.01) | |
| *G02F 1/1333* | (2006.01) | |

(52) U.S. Cl.
CPC ...... *G02F 1/136286* (2013.01); *G02F 1/1368* (2013.01); *G02F 1/133345* (2013.01); *G02F 1/134309* (2013.01); *G02F 1/136213* (2013.01); *H01L 27/1222* (2013.01); *H01L 27/1244* (2013.01); *H01L 27/1255* (2013.01); *H01L 27/1259* (2013.01); *H01L 29/78675* (2013.01)

(58) Field of Classification Search
None
See application file for complete search history.

(56) References Cited

U.S. PATENT DOCUMENTS

| | | | | |
|---|---|---|---|---|
| 2005/0174500 A1* | 8/2005 | Shiraki | ............. | G02F 1/136259 |
| | | | | 349/42 |
| 2006/0138922 A1* | 6/2006 | Kim | .................... | H01L 27/1288 |
| | | | | 257/E27.113 |
| 2007/0165147 A1* | 7/2007 | Kamijima | ........... | H01L 27/1218 |
| | | | | 257/E27.113 |
| 2012/0249906 A1* | 10/2012 | Nakagawa | ........ | G02F 1/136213 |
| | | | | 349/38 |
| 2016/0293644 A1* | 10/2016 | Sugimoto | ........... | H01L 27/1255 |
| 2022/0291557 A1* | 9/2022 | Yokota | .............. | G02F 1/136213 |

FOREIGN PATENT DOCUMENTS

| | | |
|---|---|---|
| JP | 2000098409 | 4/2000 |
| JP | 2001066633 | 3/2001 |
| JP | 2020177126 | 10/2020 |

* cited by examiner

*Primary Examiner* — Ryan Crockett
(74) *Attorney, Agent, or Firm* — JCIPRNET

(57) ABSTRACT

Provided are a scanning line extending along a first direction, a data line extending along a second direction intersecting the first direction, a TFT having a semiconductor layer including one source drain region and a channel region extending along the first direction, at a position overlapping the scanning line in plan view, and another source drain region extending along the second direction, at a position overlapping the data line in plan view, and a first capacitance element and a second capacitance element disposed at a position overlapping the data line, and the first capacitance element and the second capacitance element are configured to include a part of the semiconductor layer.

11 Claims, 36 Drawing Sheets

ELECTRO-OPTICAL DEVICE AND ELECTRONIC APPARATUS

The present application is based on, and claims priority from JP Application Serial Number 2021-028269, filed Feb. 25, 2021, the disclosure of which is hereby incorporated by reference herein in its entirety.

BACKGROUND

1. Technical Field

The present disclosure relates to an electro-optical device and an electronic apparatus.

2. Related Art

JP 2001-66633 A discloses a liquid crystal device as an electro-optical device including a transistor for supplying image signals to a pixel electrode, and a retention capacitor for retaining an image signal for a fixed period of time. For example, the transistor and the retention capacitor are configured by a part of the same semiconductor layer.

However, in the configuration of JP 2001-66633 A, there is a problem in that the retention capacitor is easily reduced due to an increase in an opening ratio, and display quality can be affected. In other words, it is required to increase an opening ratio, and to further secure the retention capacitor.

SUMMARY

An electro-optical device includes a scanning line extending along a first direction, a data line extending along a second direction intersecting the first direction, a transistor having a first semiconductor layer including one source drain region and a channel region extending along the first direction, at a position overlapping the scanning line in plan view, and another source drain region extending along the second direction, at a position overlapping the data line in plan view, and a first capacitance element and a second capacitance element disposed at a position overlapping the data line, wherein the first capacitance element and the second capacitance element are configured to include a part of the first semiconductor layer.

An electronic apparatus includes the electro-optical device described above.

DESCRIPTION OF EXEMPLARY EMBODIMENTS

In each of the drawings below, as necessary, XYZ axes are assigned as coordinate axes orthogonal to each other, a direction indicated by each arrow is referred to as a + direction, and a direction opposite the + direction is referred to as a − direction. Note that, a +Z direction may be referred to as an upside and a −Z direction as a downside, and viewing from the +Z direction is referred to as in plan view, or planarly. Furthermore, in the following description, for example, for a substrate, a description of "at the substrate" refers to any of a case of being disposed at and in contact with the substrate, a case of being disposed at the substrate via another structure, or a case where a part is disposed at and in contact with the substrate, and a part is disposed via another structure.

In the present exemplary embodiment, an active drive type liquid crystal device including a thin film transistor as a transistor for each pixel will be exemplified as an electro-optical device. Note that, hereinafter, thin film transistor is abbreviated as TFT. The liquid crystal device can be used favorably as a light modulation device in a projection-type display device as an electronic apparatus described below, for example.

First, a configuration of a liquid crystal device 100 will be described below with reference to FIG. 1 to FIG. 3.

Figure 1:
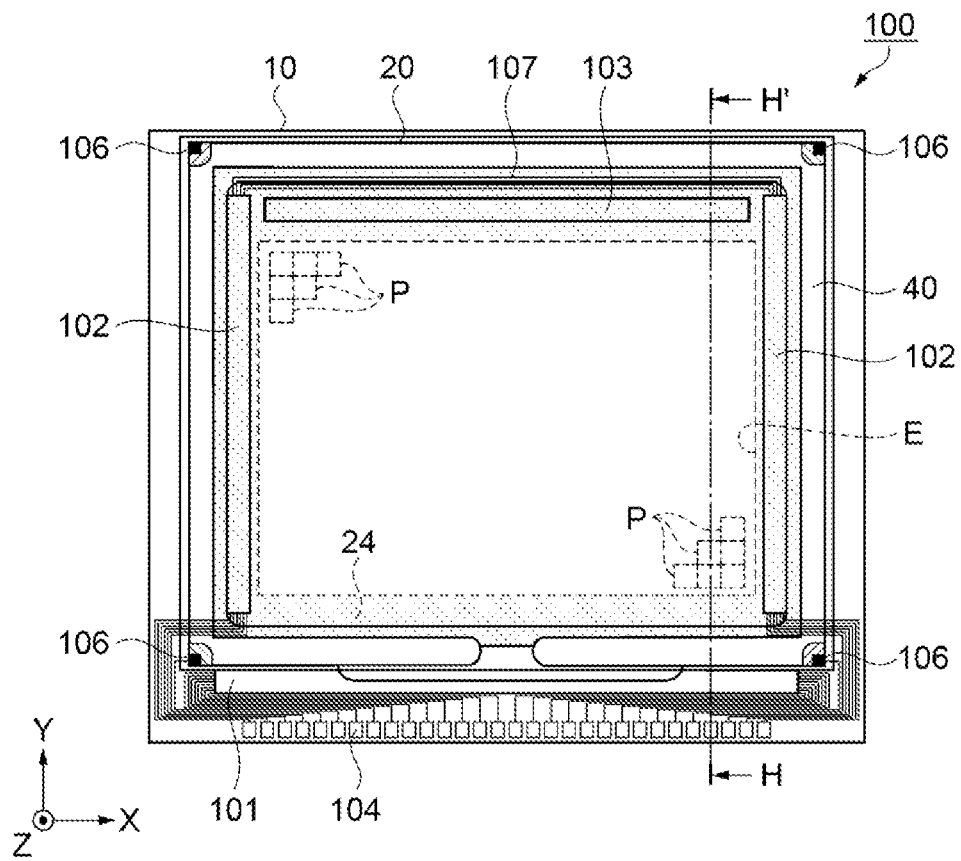
FIG. 1 is a schematic plan view illustrating a configuration of a liquid crystal device as an electro-optical device.
Figure 2:
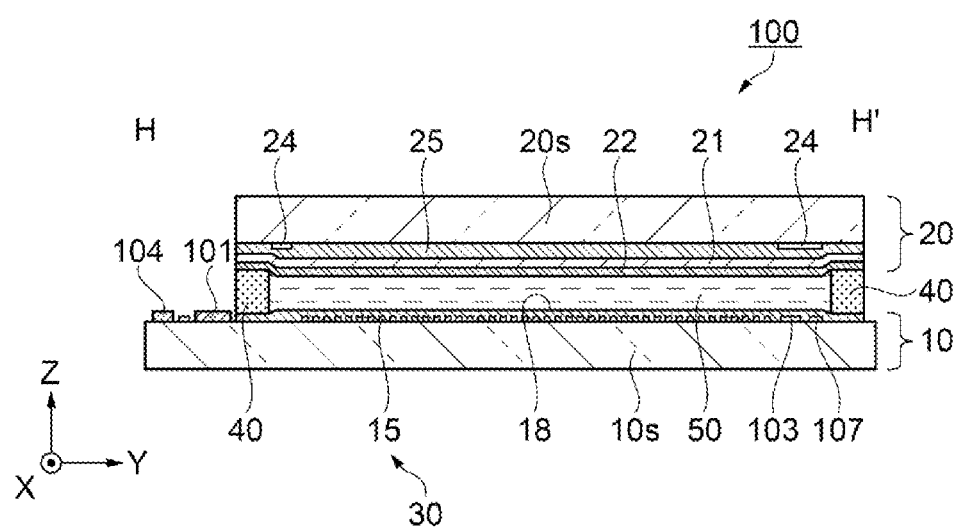
FIG. 2 is a cross-sectional view along an H-H' line of the liquid crystal device illustrated in FIG. 1.

As illustrated in FIG. 1 and FIG. 2, the liquid crystal device 100 of the present exemplary embodiment includes an element substrate 10, a counter substrate 20 disposed facing the element substrate 10, and a liquid crystal layer 50 including liquid crystal sandwiched between the element substrate 10 and the counter substrate 20.

A substrate such as a glass substrate or a quartz substrate is used for a substrate 10s of the element substrate 10. A transparent substrate such as a glass substrate or a quartz substrate is used for a substrate 20s of the counter substrate 20.

A shape in plan view of the element substrate 10 is larger than the counter substrate 20. The element substrate 10 and the counter substrate 20 are bonded to each other via a seal material 40 disposed along an outer edge of the counter substrate 20. Liquid crystal having positive or negative dielectric anisotropy is encapsulated in a gap between the element substrate 10 and the counter substrate 20 to provide the liquid crystal layer 50.

A display region E including a plurality of pixels P arrayed in a matrix is provided inside the seal material 40. A partition portion 24 is provided surrounding the display region E, between the seal material 40 and the display region E. A dummy pixel area (not illustrated) that does not contribute to display is provided around the display region E.

The element substrate 10 is provided with a terminal portion in which a plurality of external coupling terminals 104 are arrayed. A data-line drive circuit 101 is provided between a first side portion along the terminal portion and the seal material 40. In addition, an inspection circuit 103 is provided between the seal material 40 along a second side portion facing the first side portion and the display region E.

A scanning line drive circuit 102 is provided between the seal material 40 along each of a third side portion and a fourth side portion orthogonal to the first side portion and facing each other, and the display region E. Further, between the seal material 40 of the second side portion and the inspection circuit 103, a plurality of lines of wiring 107 coupling the two scanning line drive circuits 102 are provided.

A wiring line linked to the data-line drive circuit 101 and the scanning line drive circuit 102 is coupled to the plurality of external coupling terminals 104 arrayed along the first side portion. Note that, the disposition of the inspection circuit 103 is not limited to the above.

Here, directions along the first side portion are ±X directions as first directions. Further, second directions that intersect the first directions are ±Y directions, which are directions orthogonal to the first side portion and along the third side portion and the fourth side portion that face each other. In addition, normal directions of the element substrate 10 and the counter substrate 20 orthogonal to the ±X directions and the ±Y directions are ±Z directions.

As illustrated in FIG. 2, at a surface of the substrate 10s on the liquid crystal layer 50 side, a transmissive pixel electrode 15 and a TFT 30 as a transistor being a switching element, which are provided for each of the pixels P, and signal wirings, and an alignment film 18 covering these components are provided. The TFT 30 and the pixel electrode 15 are constituent elements of each pixel P. The element substrate 10 includes the substrate 10s, the pixel electrode 15, the TFT 30, the signal wirings, and the alignment film 18 that are provided at the substrate 10s. The pixel electrode 15 is provided corresponding to the TFT 30.

The partition portion 24, an insulating layer 25 formed so as to cover the partition portion 24, a counter electrode 21 as a common electrode provided covering the insulating layer 25, and an alignment film 22 covering the counter electrode 21 are provided at a surface of the substrate 20s on the liquid crystal layer 50 side. The counter substrate 20 in the present exemplary embodiment includes at least the partition portion 24, the counter electrode 21, and the alignment film 22. Note that, in the present exemplary embodiment, the example in which the common electrode is disposed on the counter substrate 20 side as the counter electrode 21 is illustrated, but the present disclosure is not limited thereto.

As illustrated in FIG. 1, the partition portion 24 surrounds the display region E and is provided at a position where the partition portion 24 planarly overlaps the scanning line drive circuit 102 and the inspection circuit 103. As a result, light incident on these circuits from the counter substrate 20 side is shielded, and erroneous operation of the circuit due to the incident light is prevented. Further, unnecessary stray light is shielded so as not to be incident on the display region E, ensuring high contrast in display in the display region E.

The insulating layer 25 is formed of an inorganic material such as, for example, silicon oxide having optical transparency. The insulating layer 25 covers the partition portion 24 and is provided so that the surface on the liquid crystal layer 50 side is flat.

The counter electrode 21 includes a transparent conductive film such as Indium Tin Oxide (ITO) or Indium Zinc Oxide (IZO), covers the insulating layer 25, and is also electrically coupled to vertical conducting portions 106 provided at four corners of the counter substrate 20, respectively. The vertical conducting portion 106 is electrically coupled to wirings on the element substrate 10 side.

The alignment film 18 covering the pixel electrode 15 and the alignment film 22 covering the counter electrode 21 are selected based on an optical design of the liquid crystal device 100. Examples of a forming material of the alignment films 18 and 22 include an inorganic alignment film such as silicon oxide, and an organic alignment film such as polyimide.

The liquid crystal device 100 thus configured is of a transmissive-type, for example, and an optical design of a normally white mode in which transmittance of the pixel P when no voltage is applied is greater than transmittance when voltage is applied, and a normally black mode in which the transmittance of the pixel P when no voltage is applied is less than transmittance when voltage is applied. A polarizing element is disposed, on each of a light incidence side and a light emitting side of a liquid crystal panel including the element substrate 10 and the counter substrate 20, in accordance with the optical design.

In the present exemplary embodiment, an example is described, in which the optical design of the normally black mode is applied, using the inorganic alignment films described as the alignment films 18 and 22, and liquid crystal having negative dielectric anisotropy.

Next, an electrical configuration of the liquid crystal device 100 will be described below with reference to FIG. 3.

Figure 3:
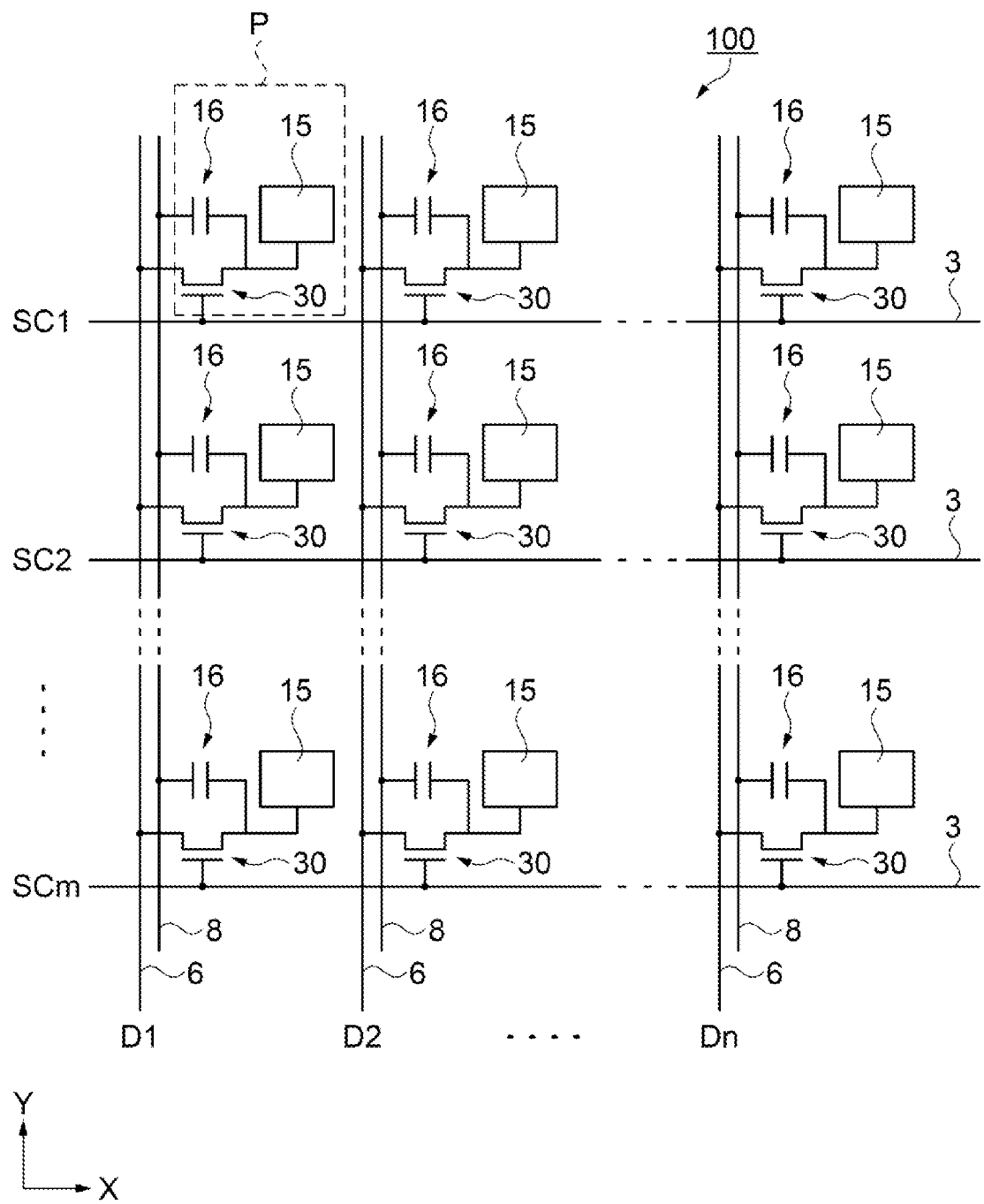
FIG. 3 is an equivalent circuit diagram illustrating the electrical configuration of a liquid crystal device.

As illustrated in FIG. 3, the liquid crystal device 100 includes a plurality of scanning lines 3, a plurality of data lines 6, and a plurality of capacitance lines 8 disposed in parallel with the data line 6, as signal wirings insulated from each other and orthogonal to each other at least in the display region E. The scanning line 3 extends in the ±X directions as the first directions. The data line 6 extends in the ±Y directions as the second directions intersecting the first directions. Note that in FIG. 3, directions in which the capacitance line 8 extends are the ±Y directions, but the present disclosure is not limited thereto.

The scanning line 3, the data line 6, and the capacitance line 8 are provided, and the pixel electrode 15, the TFT 30, and a capacitance element 16 are provided in a region partitioned by these signal wirings and the like, and these constitute a pixel circuit of the pixel P. The pixel electrode 15, the TFT 30, and capacitance element 16 are disposed for each pixel P.

The scanning line 3 is electrically coupled to a gate of the TFT 30. The data line 6 is electrically coupled to a data line side source drain region, which is one source drain region in the TFT 30. The scanning line 3 has a function to simultaneously control on and off of the TFTs 30 provided in the same row. The pixel electrode 15 is electrically coupled to a pixel electrode side source drain region, which is another source drain region in the TFT 30. A semiconductor layer including the source drain region of the TFT 30 will be described later.

The data lines 6 are electrically coupled to the data-line drive circuit 101 described above, and supply image signals D1, D2, . . . , and Dn supplied from the data-line drive circuit 101 to the pixels P. The scanning lines 3 are electrically coupled to the scanning line drive circuit 102 described above, and supply scanning signals SC1, SC2, . . . , and SCm supplied from the scanning line drive circuit 102, to the pixels P.

The image signal D1 to the image signal Dn supplied from the data-line drive circuit 101 to the data lines 6 may be line-sequentially supplied in this order, or may be supplied to the plurality of respective data lines 6 adjacent to each other in groups. The scanning line drive circuit 102 line-sequentially supplies the scanning signal SC1 to the scanning signal SCm to the scanning lines 3 in a pulsed manner at predetermined timings.

In the liquid crystal device 100, the TFTs 30 each being the switching element are brought into an on state for a fixed period of time by input of the scanning signal SC1 to the scanning signal SCm. As a result, the image signal D1 to the image signal Dn supplied from the data lines 6 are written to the pixel electrodes 15 at predetermined timing. The image signal D1 to the image Dn of a predetermined level written into the liquid crystal layer 50 via pixel electrodes 15 are held for a certain period between the pixel electrodes 15 and the counter electrode 21, which are disposed facing the pixel electrodes 15 being intervened by the liquid crystal layer 50.

To prevent the image signal D1 to the image signal Dn held from leaking, the capacitance element 16 is coupled in parallel with a liquid crystal capacitor provided between the pixel electrode 15 and the counter electrode 21. Details of the semiconductor layer and the capacitance element 16 will be described later.

Here, although not illustrated in FIG. 3, the inspection circuit 103 described above is coupled to the data line 6. Therefore, in a manufacturing process of the liquid crystal device 100, the above image signal can be detected via the inspection circuit 103, to check operational malfunction and the like of the liquid crystal device 100.

Next, a configuration of the pixel P in the liquid crystal device 100 will be described with reference to FIG. 4.

Figure 4:
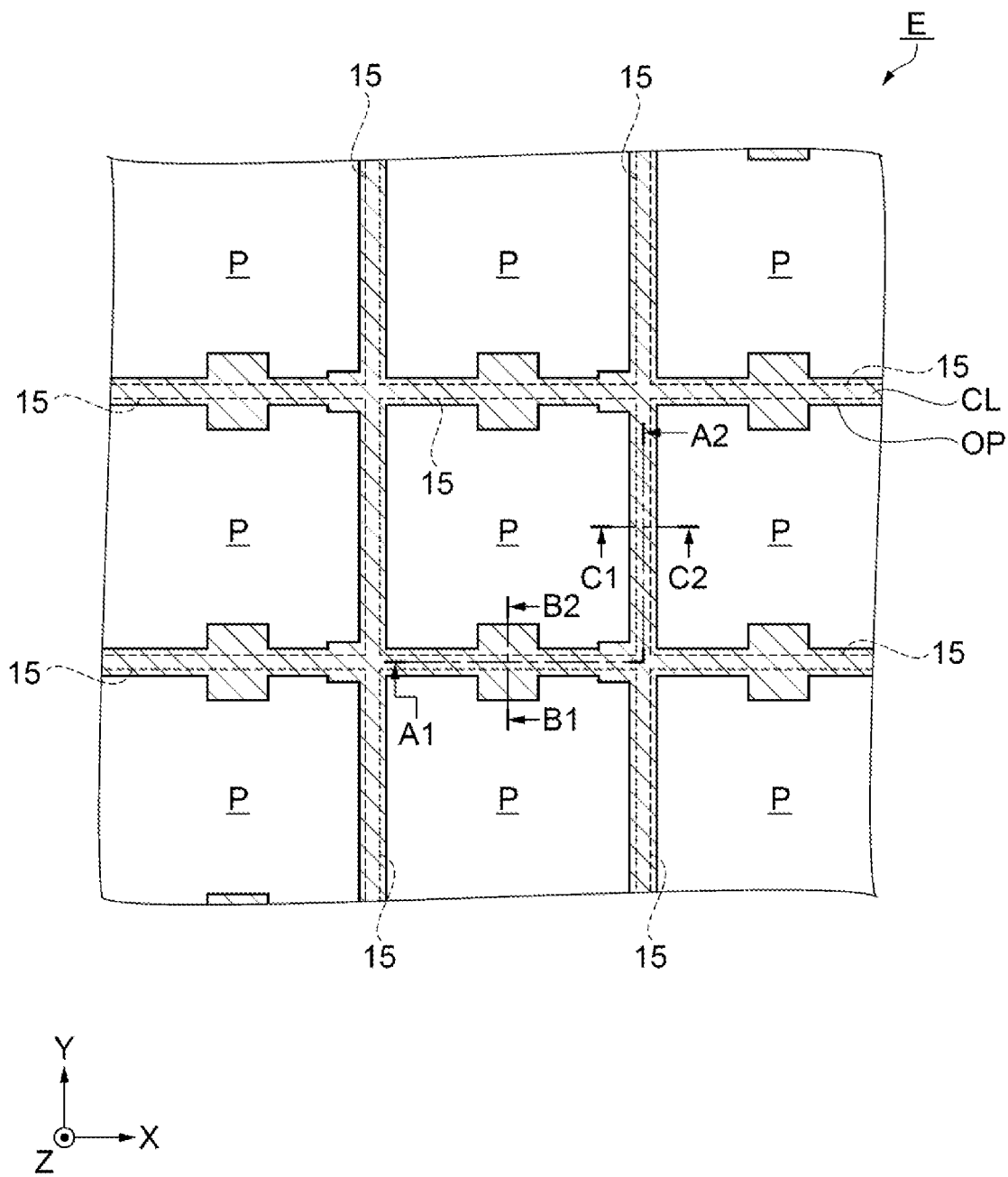
FIG. 4 is a schematic plan view illustrating arrangement of a pixel.

As illustrated in FIG. 4, the pixels P in the liquid crystal device 100 are disposed in a matrix in the ±X directions and the ±Y directions in the display region E. The pixel P has, for example, an opening region OP that is substantially square in plan view. The opening region OP is surrounded by closed regions CL having a light shielding property, extending in the ±X directions and in the ±Y directions, and provided in a lattice pattern.

In the closed region CL extending in the ±X directions, the scanning line 3 described above is provided. A conductive member having a light shielding property is used for each scanning line 3, and the closed region CL partially includes the scanning line 3.

In the closed region CL extending in the ±Y directions, the data line 6 described above is provided. A conductive member having a light shielding property is also used for the data line 6, and the closed region CL partially includes the data line 6.

The closed regions CL are constituted by the scanning line 3, the data line 6, the TFT 30, the capacitance line 8, and the like provided at the element substrate 10. Furthermore, the closed region CL may include a light shielding portion provided in the same layer as the partition portion 24 illustrated in FIG. 2 and being a black matrix patterned in a lattice shape, in the counter substrate 20.

In the closed region CL extending in the ±X directions, in a middle of the ±X directions corresponding to each pixel P, contact holes are provided sandwiching the TFT 30 described above in the ±Y directions. Therefore, a width in the ±Y directions of the closed region CL is larger in a region where the contact hole is provided, compared to the other regions. In addition, in the closed region CL extending in the ±Y directions, the capacitance element 16 is provided between the pixels P adjacent to each other. Detailed structure of the pixel P including the contact hole and the capacitance element 16 described above will be described later.

The pixel electrode 15, which has a substantially square shape in plan view, is provided for each of the pixels P. The pixel electrode 15 is provided in the opening region OP such that an outer edge overlaps the closed region CL. A plurality of the pixel electrodes 15 are disposed in a matrix corresponding to the pixels P.

The liquid crystal device 100 of the present exemplary embodiment is of the transmissive-type as described above, and is configured assuming that light is incident from the counter substrate 20 side. As such, the element substrate 10 is provided with structure that reduces not only light directly incident on the TFT 30, but also diffraction light, reflected light, and the like originating from incident light. Further, the liquid crystal device 100 includes the capacitance element 16 having an increased retention capacitor.

Note that, an incident direction of light on the liquid crystal device 100 is not limited to from the counter substrate 20 side, but may be from the element substrate 10 side. In addition, the liquid crystal device 100 may have a configuration in which a focusing means such as a microlens that focuses incident light on each pixel P is provided at a substrate on a side on which light is incident.

Next, a configuration in which the element substrate 10 of the liquid crystal device 100 is viewed in cross-sectional view will be described with reference to FIG. 5. Note that, in FIG. 5, each of the A1-A2 line, C1-C2 line, and B1-B2 line in FIG. 4 is included, and three cross-sections along the ±Z directions are illustrated side by side. Further, FIG. 5 does not illustrate the alignment film 18.

Figure 5:
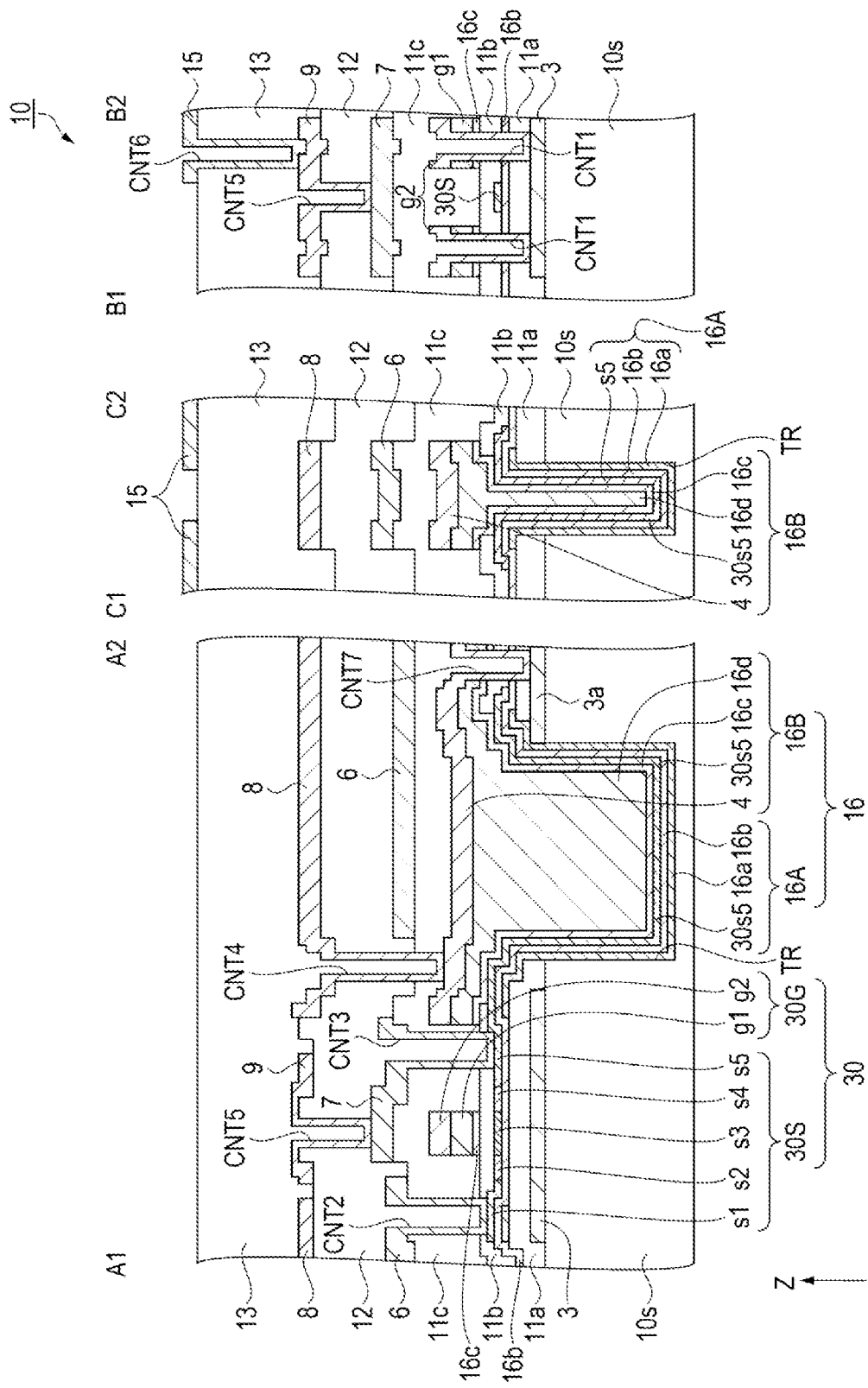
FIG. 5 is a schematic cross-sectional view illustrating structure of an element substrate.

As illustrated in FIG. 5, the element substrate 10 of the liquid crystal device 100 includes the substrate 10s, the scanning line 3, the TFT 30 including a semiconductor layer 30S and a gate electrode 30G, the capacitance element 16, the data line 6, and a plurality of interlayer insulating layers. The substrate 10s of the element substrate 10 has a trench TR as a recessed portion. A first layer to a sixth layer are layered as a plurality of layers at the substrate 10s.

The plurality of layers in the element substrate 10 have, in order from below, the first layer including the scanning line 3, the second layer including the semiconductor layer 30S, the third layer including the gate electrode 30G, the fourth layer including the data line 6, the fifth layer including the capacitance line 8 as a capacitive wiring, and the sixth layer including the pixel electrode 15.

A first interlayer insulating layer 11a and a first capacitor insulating layer 16b are provided between the first layer and the second layer, a gate insulating layer 11b and a second capacitor insulating layer 16c are provided between the second layer and the third layer, a second interlayer insulating layer 11c is provided between the third layer and the fourth layer, and a third interlayer insulating layer 12 is provided between the fourth layer and the fifth layer, and a fourth interlayer insulating layer 13 is provided between the fifth layer and the sixth layer. This prevents occurrence of a short circuit between the layers.

The first layer on the substrate 10s is provided with the scanning line 3 and a relay electrode 3a. The scanning line 3 and the relay electrode 3a are provided in the closed region CL illustrated in FIG. 4 in plan view. The scanning line 3 has a part extending in the ±X directions and a part protruding from the part in the ±Y directions, and the relay electrode 3a is provided so as to be separated in the −Y direction of the scanning line 3 (see FIG. 8).

A known forming material having a light shielding property and electrical conductivity can be adopted for the scanning line 3. Therefore, the scanning line 3 primarily has a function of shielding light incident on the semiconductor layer 30S as a first semiconductor layer from below. In the present exemplary embodiment, tungsten silicide is used as the forming material of the scanning line 3 and the relay electrode 3a. A thickness of each of the scanning line 3 and the relay electrode 3a is, for example, approximately 150 nm. Note that, in the present specification, a thickness of each layer in the ±Z directions is also simply referred to as a "thickness".

The first interlayer insulating layer 11a and the first capacitor insulating layer 16b are provided between the scanning line 3 and the relay electrode 3a, and the semiconductor layer 30S. The first interlayer insulating layer 11a insulates the scanning lines 3 from the TFT 30. Examples of a forming material of the first interlayer insulating layer 11a include, for example, silicon oxide (Non-doped Silicate Glass: NSG) and silicon nitride. In the present exemplary embodiment, silicon oxide is used as the forming material of the first interlayer insulating layer 11a. A thickness of the first interlayer insulating layer 11a is, for example, approximately 200 nm. Furthermore, a part of the relay electrode 3a is in contact with a first capacitance electrode 16a, which is a second semiconductor layer. The first capacitance electrode 16a is provided at a part that includes the first interlayer insulating layer 11a and the trench TR formed in a part of the substrate 10s, and a contact portion with the first capacitance electrode 16a. The first capacitance electrode 16a is a conductive polysilicon layer, for example, having a thickness of approximately 50 nm.

The first layer, the second layer, and the third layer are provided with the TFT 30, a first capacitance element 16A, and a second capacitance element 16B. The TFT 30 has the semiconductor layer 30S provided in the second layer, and the gate electrode 30G provided in the third layer. LDD (Lightly Doped Drain) structure is formed in the semiconductor layer 30S of the TFT 30.

The semiconductor layer 30S is provided in the closed region CL illustrated in FIG. 4 in plan view. Specifically, the semiconductor layer 30S is bent in the ±Y directions from the ±X directions in correspondence with a part in the closed region CL where the ±X directions and the ±Y directions intersect (see FIG. 12). In the semiconductor layer 30S, each of one source drain region s1, one LDD region s2, a channel region s3, another LDD region s4, and a part of another source drain region s5 extends along the ±X directions at a position overlapping the scanning line 3 in plan view.

Of the semiconductor layer 30S, the other source drain region s5 is bent in the ±Y directions from the ±X directions in plan view, and extends along the ±Y directions. In the other source drain region s5, a part of a part that extends in the ±Y directions is at a position overlapping the data line 6 in plan view, and is also provided in an inside of the trench TR, which will be described later. A part of the other source drain region s5 that extends in the ±Y directions constitutes a second capacitance electrode 30s5 as a common capacitance electrode for the first capacitance element 16A and the second capacitance element 16B. The second capacitance electrode 30s5 is a part of the first semiconductor layer.

The semiconductor layer 30S has the LDD regions s2 and s4 with high electrical resistance with the channel region s3 interposed therebetween. Thus, a leakage current at an off time is suppressed. In terms of leakage current suppression at the off time, a configuration may be adopted in which the LDD region s4 is included in a junction portion between the other source drain region s5 to which the first capacitance element 16A, the second capacitance element 16B, and the pixel electrode 15 are electrically coupled, and the channel region s3. The semiconductor layer 30S includes a polysilicon film obtained by applying a crystallizing process to an amorphous silicon film, for example. A thickness of the semiconductor layer 30S is approximately 50 nm, for example.

The gate insulating layer 11b is provided covering the semiconductor layer 30S. The gate insulating layer 11b is present between the semiconductor layer 30S and the gate electrode 30G, and insulates the semiconductor layer 30S from the gate electrode 30G. The gate insulating layer 11b has, for example, double structure formed of two types of silicon oxide. A thickness of the gate insulating layer 11b is not particularly limited, but is approximately 75 nm, for example.

The second capacitor insulating layer 16c is provided covering a part of the gate insulating layer 11b, and a part of the other source drain region s5. Of the second capacitor insulating layer 16c, a part overlapping the channel region s3 in plan view insulates the semiconductor layer 30S from the gate electrode 30G, together with the gate insulating layer 11b. A part of the second capacitor insulating layer 16c overlapping the other source drain region s5 functions as a dielectric layer of the capacitance element 16. A part of the second capacitor insulating layer 16c present between the semiconductor layer 30S and the gate electrode 30G functions as a gate insulating film together with the gate insulating layer 11b, but the gate insulating film may be configured only by the gate insulating layer 11b.

A dielectric material is used for the second capacitor insulating layer 16c. Examples of the dielectric material include silicon nitride, silicon oxide, hafnium oxide, aluminum oxide, tantalum oxide, and the like, and a single layer or a combination of these films is used. A thickness of the second capacitor insulating layer 16c may be thinner than the thickness of the gate insulating layer 11b, and is approximately 20 nm, for example.

The gate electrode 30G is provided in the third layer so as to face the channel region s3 of the semiconductor layer 30S in the Z direction. The gate electrode 30G includes a first gate electrode g1 and a second gate electrode g2. The first gate electrode g1 is disposed above the channel region s3 via the gate insulating layer 11b and the second capacitor insulating layer 16c. The second gate electrode g2 is disposed above the first gate electrode g1. In addition, third capacitance electrodes 16d and 4 that are separated from the gate electrode 30G are provided facing the first capacitance electrode 16a of a part including the trench TR in the Z direction. The third capacitance electrode 16d and the third capacitance electrode 4 correspond to the first gate electrode g1 and the second gate electrode g2, respectively.

As a forming material of the first gate electrode g1, conductive polysilicon, metal silicide, metal, a metallic compound, or the like is used. In the present exemplary embodiment, the first gate electrode g1 includes double-layer structure of a conductive polysilicon film and a tungsten silicide film. A thickness of the first gate electrode g1 is approximately 150 nm, for example.

Here, in the present exemplary embodiment, hereinafter, the conductive polysilicon film refers to a polysilicon film in which phosphorus atoms are injected and electrical conductivity is given. Note that, the atoms to be injected are not limited to the phosphorus atoms.

A metallic compound having a light shielding property such as tungsten silicide is used for a forming material of the second gate electrode g2. A thickness of the second gate electrode g2 is approximately 60 nm, for example.

The second gate electrode g2 is electrically coupled to the scanning line 3 via a pair of second contact holes CNT1. The pair of second contact holes CNT1 penetrate the first interlayer insulating layer 11a, the first capacitor insulating layer 16b, the gate insulating layer 11b, the second capacitor insulating layer 16c, and the first gate electrode g1. The pair of second contact holes CNT1 are disposed so as to face each other in the ±Y directions and sandwich a part of the semiconductor layer 30S (see FIG. 20).

The trench TR is provided along the +X direction side of the pixel P in plan view in the closed region CL described above. The trench TR is a substantially rectangular recessed portion in plan view. The trench TR includes a bottom surface along an XY plane and a side surface along the ±Z directions, and an upside is open.

The first capacitance element 16A and the second capacitance element 16B described above are provided in an inside of the trench TR in order from the substrate 10s side. The first capacitance element 16A is constituted by the first capacitance electrode 16a, the first capacitor insulating layer 16b, and the second capacitance electrode 30s5. The second capacitance element 16B is constituted by the second capacitance electrode 30s5, the second capacitor insulating layer 16c, and the third capacitance electrodes 16d and 4. The first capacitance electrode 16a and the third capacitance electrodes 16d and 4 are electrically coupled via the relay electrode 3a, and applied with common potential. The second capacitance electrode 30s5 is electrically coupled to a pixel electrode. The first capacitance element 16A and the second capacitance element 16B have a function of increasing a retention capacitor and improve potential retention characteristics in the pixel electrode 15.

Each layer constituting the first capacitance element 16A and the second capacitance element 16B described above is provided covering a side surface and a bottom surface of the trench TR, and further increases the retention capacitor. Note that, the first capacitance element 16A and the second capacitance element 16B are also partially provided at an upper edge of the trench TR in addition to the inside of the trench TR.

Above the gate electrode 30G and the third capacitance electrode 4, the second interlayer insulating layer 11c is provided covering these electrodes. The second interlayer insulating layer 11c is also provided at a position that planarly overlaps the TFT 30. The second interlayer insulating layer 11c is provided by using more than one types of silicon-based oxide films such as an NEOS (Tetraethyl Orthosilicate) film, an NSG film, a PSG (Phospho Silicate Glass) film containing phosphorus (P), a BSG (Boro Silicate Glass) film containing boron (B), and a BPSG (Boro-Phospho Silicate Glass) film containing boron and phosphorus. In the present exemplary embodiment, silicon oxide is used as a forming material of the second interlayer insulating layer 11c. A thickness of the second interlayer insulating layer 11c is approximately 400 nm, for example.

Contact holes CNT2 and CNT3 are provided in the second interlayer insulating layer 11c. The contact holes CNT2 and CNT3 penetrate the second interlayer insulating layer 11c and the gate insulating layer 11b, and reach the semiconductor layer 30S. Specifically, the contact hole CNT2 electrically couples the one source drain region s1 of the semiconductor layer 30S and the data line 6 in an upper layer. The contact hole CNT3 electrically couples the other source drain region s5 of the semiconductor layer 30S and a second relay layer 7, which will be described later.

The data line 6 and the second relay layer 7 are provided in the fourth layer above the third layer covering the second interlayer insulating layer 11c and the like. As described above, the data line 6 extends in the ±Y directions in the closed region CL of the pixel P. The data line 6 is electrically coupled to the one source drain region s1 of the semiconductor layer 30S via the contact hole CNT2.

The second relay layer 7 is provided in an independent island shape in plan view. The second relay layer 7 is electrically coupled to the other source drain region s5 of the semiconductor layer 30S via the contact hole CNT3.

A forming material of the data line 6 and the second relay layer 7 is not particularly limited as long as the material is a low-resistance wiring material having electrical conductivity, but examples include metal such as aluminum (Al) and titanium (Ti), and metallic compounds thereof, for example. In the present exemplary embodiment, the data line 6 and the second relay layer 7 have four-layer structure of titanium (Ti) layer/titanium nitride (TiN) layer/aluminum (Al) layer/titanium nitride (TiN) layer. A thickness of each of the data line 6 and the second relay layer 7 is, for example, approximately 350 nm.

The third interlayer insulating layer 12 is provided covering the data line 6, the second relay layer 7, and the like. A forming material similar to that of the first interlayer insulating layer 11a is employed for the third interlayer insulating layer 12, for example. In the present exemplary embodiment, silicon oxide is used for the third interlayer insulating layer 12. A thickness of the third interlayer insulating layer 12 is not particularly limited, but is approximately 400 nm, for example.

Contact holes CNT4 and CNT5 are provided in the third interlayer insulating layer 12. The contact hole CNT4 penetrates the second interlayer insulating layer 11c and the third interlayer insulating layer 12, and electrically couples the third capacitance electrode 4 of the second capacitance element 16B and the capacitance line 8 above the third interlayer insulating layer 12.

The contact hole CNT5 penetrates the third interlayer insulating layer 12, and electrically couples the second relay layer 7 and a first relay layer 9 in an upper layer of the third interlayer insulating layer 12.

The capacitance line 8 and the first relay layer 9 are provided in the fifth layer above the fourth layer. The capacitance line 8 overlaps the data line 6 extending in the ±Y directions in plan view. Although not illustrated, the capacitance line 8 is electrically coupled to the vertical conduction portion 106 of the counter substrate 20 described above. As a result, the capacitance line 8 is electrically coupled to the counter electrode 21 and is provided with common potential. As a result, the capacitance line 8 prevents effects of potential of the data line 6 and the scanning line 3 from affecting the pixel electrode 15. The capacitance line 8 is also electrically coupled to the third capacitance electrodes 16d and 4 of the second capacitance element 16B via the contact hole CNT4.

Figure 22:
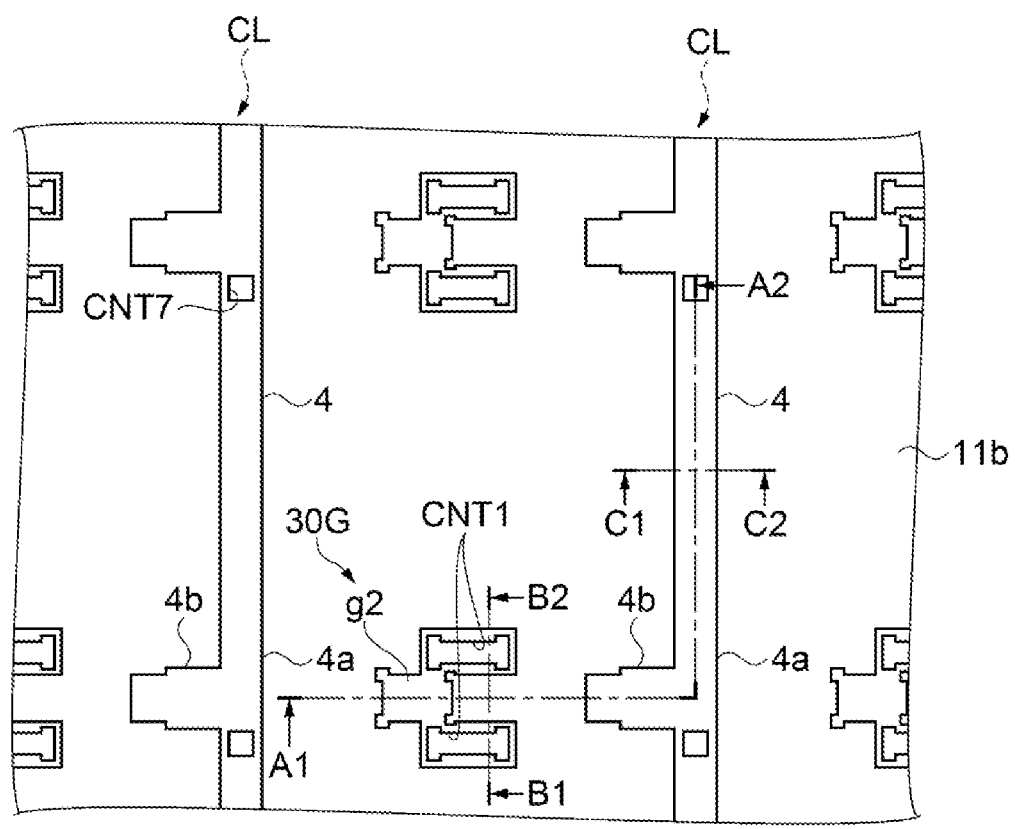
FIG. 22 is a schematic plan view illustrating the method for manufacturing the element substrate.

The first relay layer 9 is provided in an independent island shape in plan view (see FIG. 22). The first relay layer 9 is electrically coupled to the second relay layer 7 via the contact hole CNT5.

A forming material of the capacitance line 8 and the first relay layer 9 is, similar to the data line 6, not particularly limited as long as the material is a low-resistance wiring material having electrical conductivity, but examples include metal such as aluminum (Al) and titanium (Ti), and metallic compounds thereof, for example. In the present exemplary embodiment, the capacitance line 8 and the first relay layer 9 have four-layer structure of titanium (Ti) layer/titanium nitride (TiN) layer/aluminum (Al) layer/titanium nitride (TiN) layer. A thickness of each of the capacitance line 8 and the first relay layer 9 is, for example, approximately 250 nm.

The fourth interlayer insulating layer 13 is provided covering the capacitance line 8 and the first relay layer 9. Examples of a forming material of the fourth interlayer insulating layer 13 include a silicon-based oxide film similar to the first interlayer insulating layer 11a, for example. In the present exemplary embodiment, silicon oxide is used for the fourth interlayer insulating layer 13. A thickness of the fourth interlayer insulating layer 13 is approximately 300 nm, for example.

A first contact hole CNT6 is provided in the fourth interlayer insulating layer 13. The first contact hole CNT6 electrically couples the first relay layer 9 and the pixel electrode 15 in an upper layer of the fourth interlayer insulating layer 13. The first contact hole CNT6 overlaps one in the +Y direction of the pair of second contact holes CNT1 in plan view (see FIG. 20 and FIG. 33).

The pixel electrode 15 is provided in the sixth layer above the fifth layer. The pixel electrode 15 is electrically coupled to the other source drain region s5 that also serves as a common capacitance electrode for the capacitance elements 16A and 16B via the first contact hole CNT6, the first relay layer 9, the contact hole CNT5, the second relay layer 7, and the contact hole CNT3. The pixel electrode 15 is provided by forming a transparent conductive film made of ITO, IZO, or the like, for example, and then performing patterning. In the present exemplary embodiment, ITO is used for the pixel electrode 15. A thickness of the pixel electrode 15 is approximately 145 nm, for example.

Although not illustrated, the alignment film 18 is provided covering the pixel electrode 15. The alignment film 18 of the element substrate 10, and the alignment film 22 of the counter substrate 20 described above are each formed of a collection of columns in each of which an inorganic material such as silicon oxide is deposited and grown in a columnar shape from a predetermined direction such as an oblique direction. In addition, liquid crystal molecules included in the liquid crystal layer 50 illustrated in FIG. 2 have negative dielectric anisotropy with respect to the alignment films 18 and 22.

Next, a method for manufacturing the liquid crystal device 100 will be described below with reference to FIG. 6 to FIG. 33.

Figure 6:
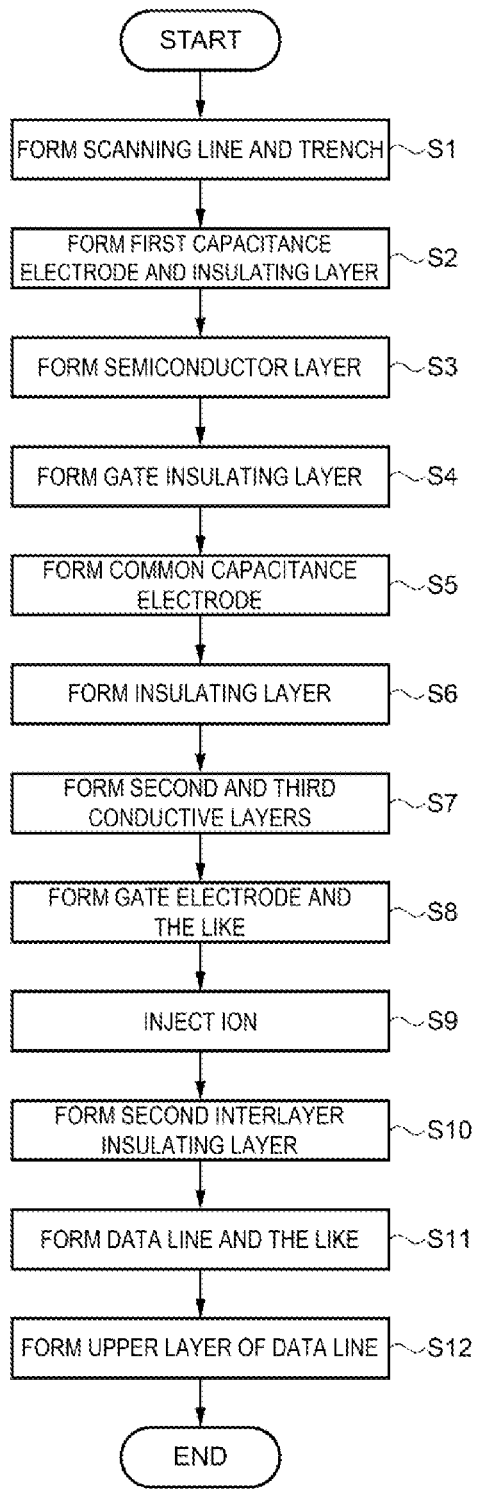
FIG. 6 is a process flow diagram illustrating a method for manufacturing the element substrate of a method for manufacturing the liquid crystal device.

FIG. 6 is a process flow diagram illustrating a method for manufacturing the element substrate 10 of the method for manufacturing the liquid crystal device 100. FIG. 7, FIG. 9, FIG. 11, FIG. 13, FIG. 15A, FIG. 15B, FIG. 17, FIG. 19A, FIG. 19B, FIG. 21, FIG. 23, FIG. 25, FIG. 27, FIG. 29, and FIG. 31 are schematic cross-sectional views illustrating the method for manufacturing the element substrate 10. FIG. 8, FIG. 10, FIG. 12, FIG. 14, FIG. 16, FIG. 18, FIG. 20, FIG. 22, FIG. 24, FIG. 26, FIG. 28, FIG. 30, FIG. 32, and FIG. 33 are schematic plan views illustrating the method for manufacturing the element substrate 10. In the following description, see also FIG. 5.

Here, in the schematic cross-sectional views described above, in the same manner as in FIG. 5, three cross sections corresponding to the line segment A1-A2, the line segment C1-C2, and the line segment B1-B2 illustrated in FIG. 4 are illustrated side by side. Furthermore, in the schematic plan views described above, a periphery of one opening region OP illustrated in FIG. 4 is enlarged and illustrated. Note that, hereinafter, unless otherwise indicated, a state in plan view will be described in the description of the schematic plan view.

The method for manufacturing the liquid crystal device 100 of the present exemplary embodiment includes the method for manufacturing the element substrate 10 described below, and known techniques can be employed except for steps included in the method for manufacturing the element substrate 10. Therefore, in the following description, only the method for manufacturing the element substrate 10 will be described. Also, in the method for manufacturing the element substrate 10, known techniques can be employed unless otherwise indicated.

As illustrated in FIG. 6, the method for manufacturing the element substrate 10 of the present exemplary embodiment includes steps S1 to S12. Hereinafter, each step from step S1 to step S12 will be described. Note that, the process flow illustrated in FIG. 6 is an example and the present disclosure is not limited thereto.

Figure 7:
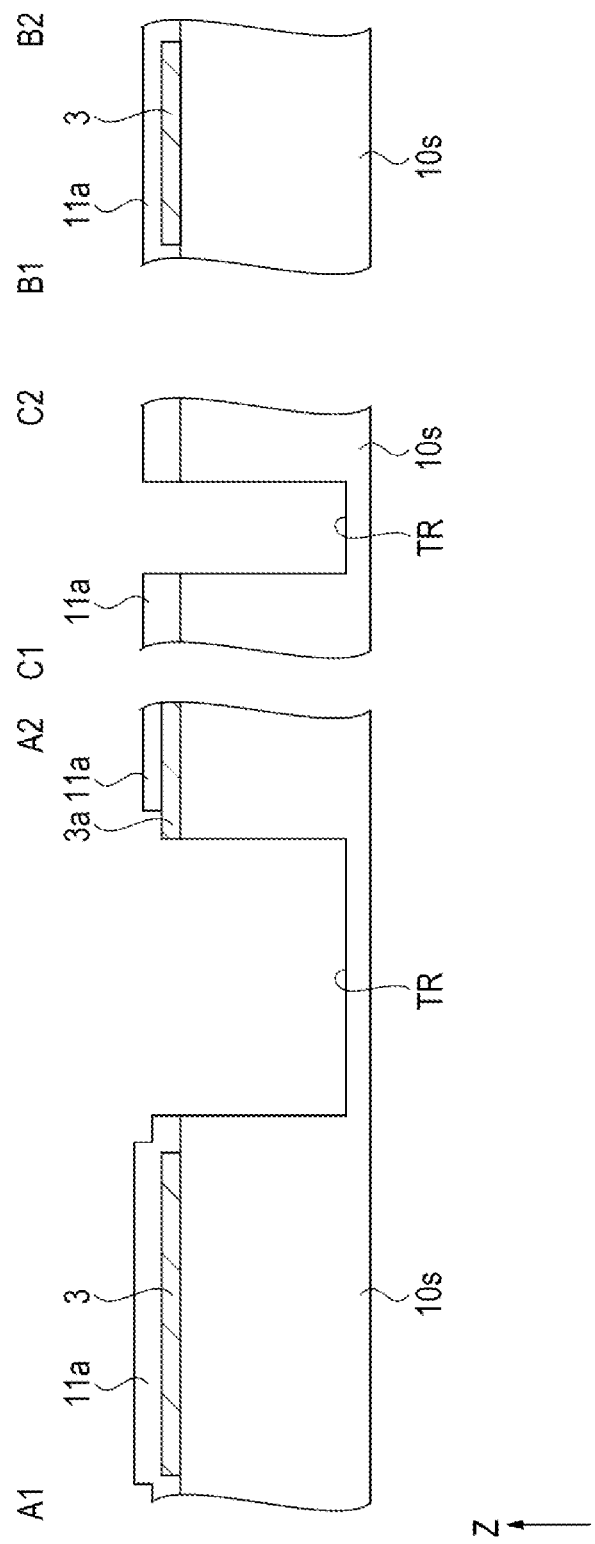
FIG. 7 is a schematic cross-sectional view illustrating the method for manufacturing the element substrate.
Figure 8:
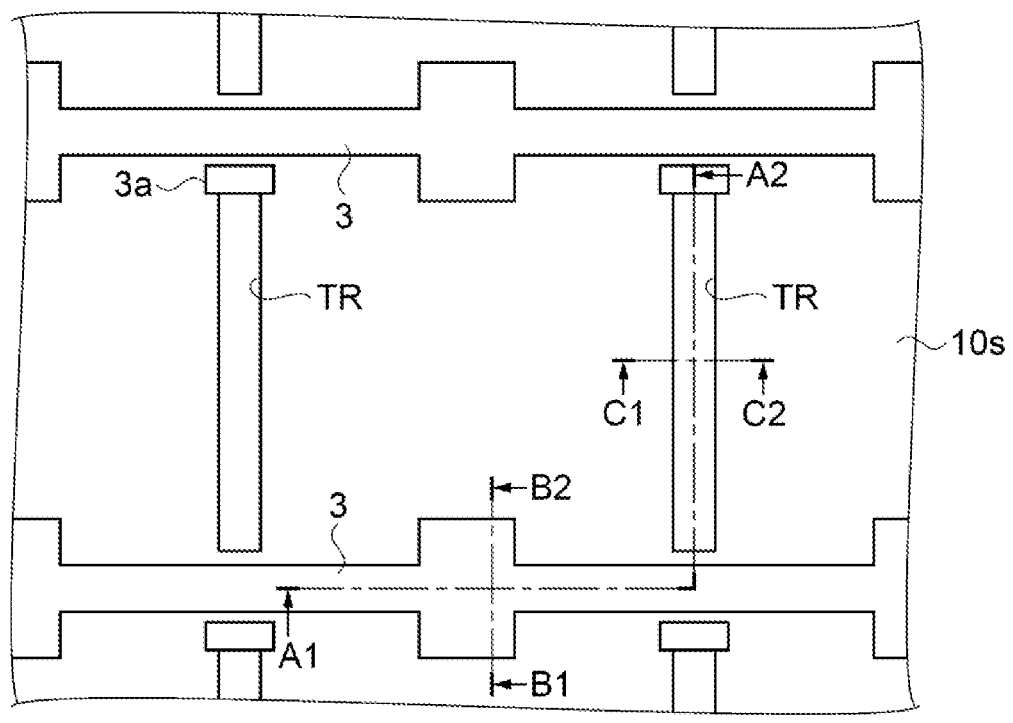
FIG. 8 is a schematic plan view illustrating the method for manufacturing the element substrate.

In step S1, as illustrated in FIG. 7 and FIG. 8, the scanning line 3, the relay electrode 3a, and the trench TR are formed at the substrate 10s. First, the scanning line 3 and the relay electrode 3a are provided at the substrate 10s. The scanning line 3 has a part extending in the ±X directions, and a part protruding from the above part in the ±Y directions. The pair of second contact holes CNT1 are provided in the part protruding in the ±Y directions (see FIG. 19A and FIG. 20). Patterning forming using, for example, a photolithography method is used for forming the scanning line 3.

Next, the first interlayer insulating layer 11a is formed in a solid form at the scanning line 3, the relay electrode 3a, and the substrate 10s. For forming the first interlayer insulating layer 11a, an atmospheric pressure CVD (Chemical Vapor Deposition) method, a low-pressure CVD method, or a plasma CVD method using a processing gas such as monosilane ($SiH_4$), dichlorosilane ($SiH_2Cl_2$), tetraethoxysilane (TEOS), or ammonia ($NH_3$) is used, for example.

Next, the trench TR is provided in the first interlayer insulating layer 11a and the substrate 10s. Specifically, as illustrated in FIG. 8, the trench TR is present between the pixels P adjacent to each other in the ±X directions, and has a substantially rectangular shape that fits in the closed region CL. The trench TR, although not particularly limited, for example, has a depth in the ±Z directions of approximately 3 μm, and a width in the ±X directions of approximately 1 μm. Wet etching using a hard mask is used to form the trench TR, for example.

At this time, etching is performed using a hard mask such that a part of the relay electrode 3a is exposed in the +Y direction of the trench TR. As a result, a part of the relay electrode 3a is exposed adjacent to the trench TR. The relay electrode 3a is a portion that is electrically coupled to the first capacitance electrode 16a subsequently. Then, the processing proceeds to step S2.

Figure 9:
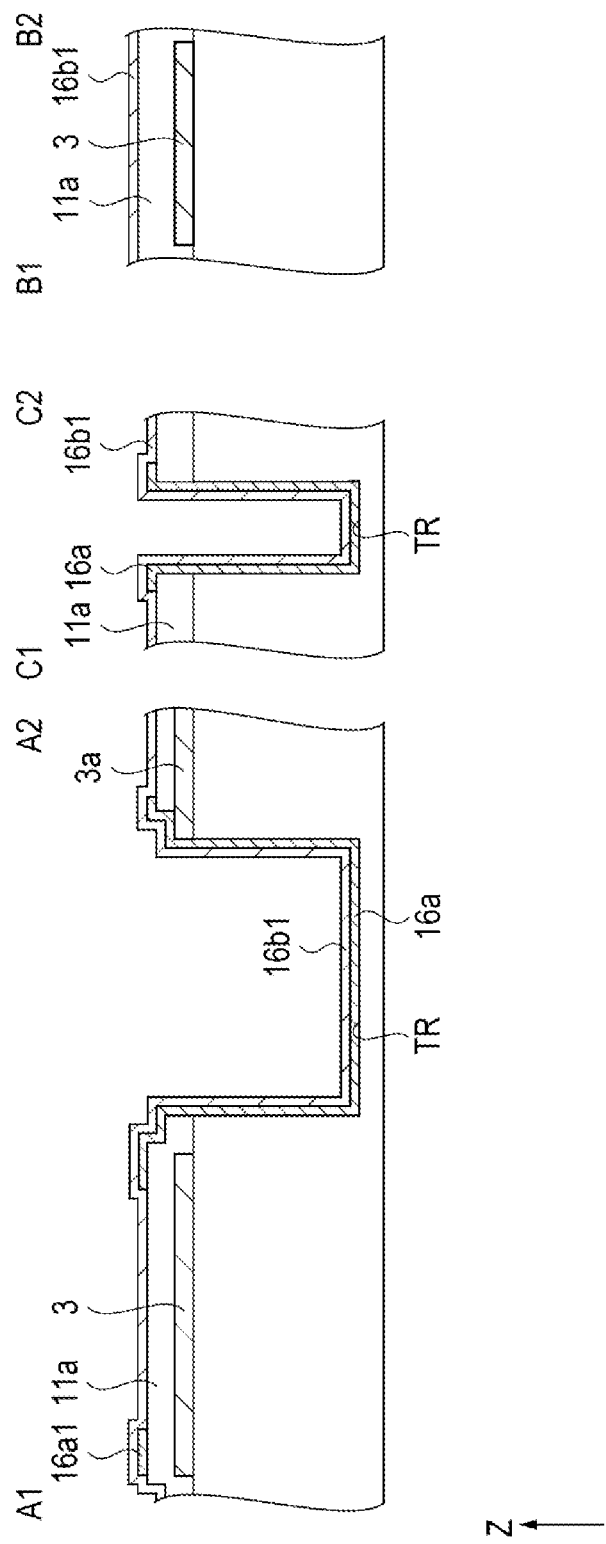
FIG. 9 is a schematic cross-sectional view illustrating the method for manufacturing the element substrate.
Figure 10:
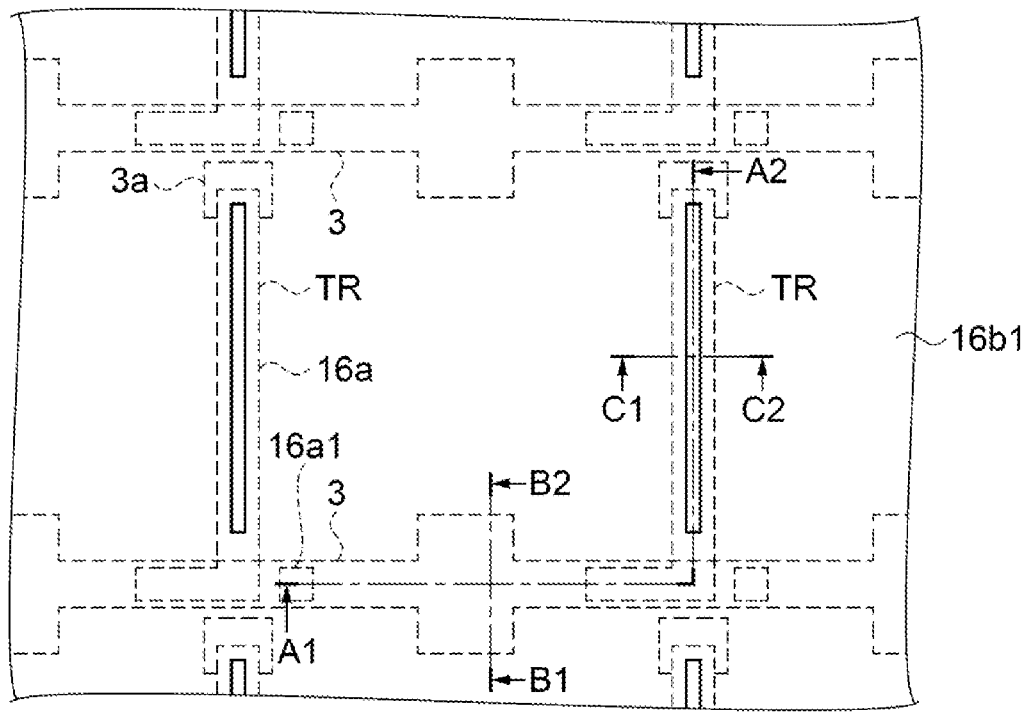
FIG. 10 is a schematic plan view illustrating the method for manufacturing the element substrate.
Figure 10:
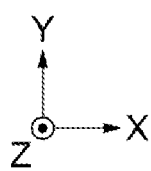

In step S2, as illustrated in FIG. 9 and FIG. 10, the first capacitance electrode 16a and an insulating layer 16b1 are provided at the substrate 10s including the first interlayer insulating layer 11a and the inside of the trench TR. The first capacitance electrode 16a is a polysilicon layer, and is formed by using a low-pressure CVD method. The polysilicon layer is then patterned to provide the first capacitance electrode 16a.

Specifically, the first capacitance electrode 16a is provided bent in the ±Y directions from the ±X directions. Although not illustrated, the first capacitance electrode 16a is disposed overlapping the closed region CL. In addition, a first capacitance electrode 16a1 having an island shape is provided separated from the first capacitance electrode 16a provided in a bent manner. The island shaped first capacitance electrode 16a1 is a portion that overlaps the one source drain region s1 that is subsequently formed.

In addition, the insulating layer 16b1 is a layer that becomes the first capacitor insulating layer 16b of the first capacitance element 16A in the subsequent step. The insulating layer 16b1 is provided in a solid form so as to cover the first capacitance electrode 16a and the first interlayer insulating layer 11a. Specifically, the insulating layer 16b1 is provided by a low-pressure CVD method, a plasma CVD method, or the like using silicon nitride. Then the processing proceeds to step S3.

Figure 11:
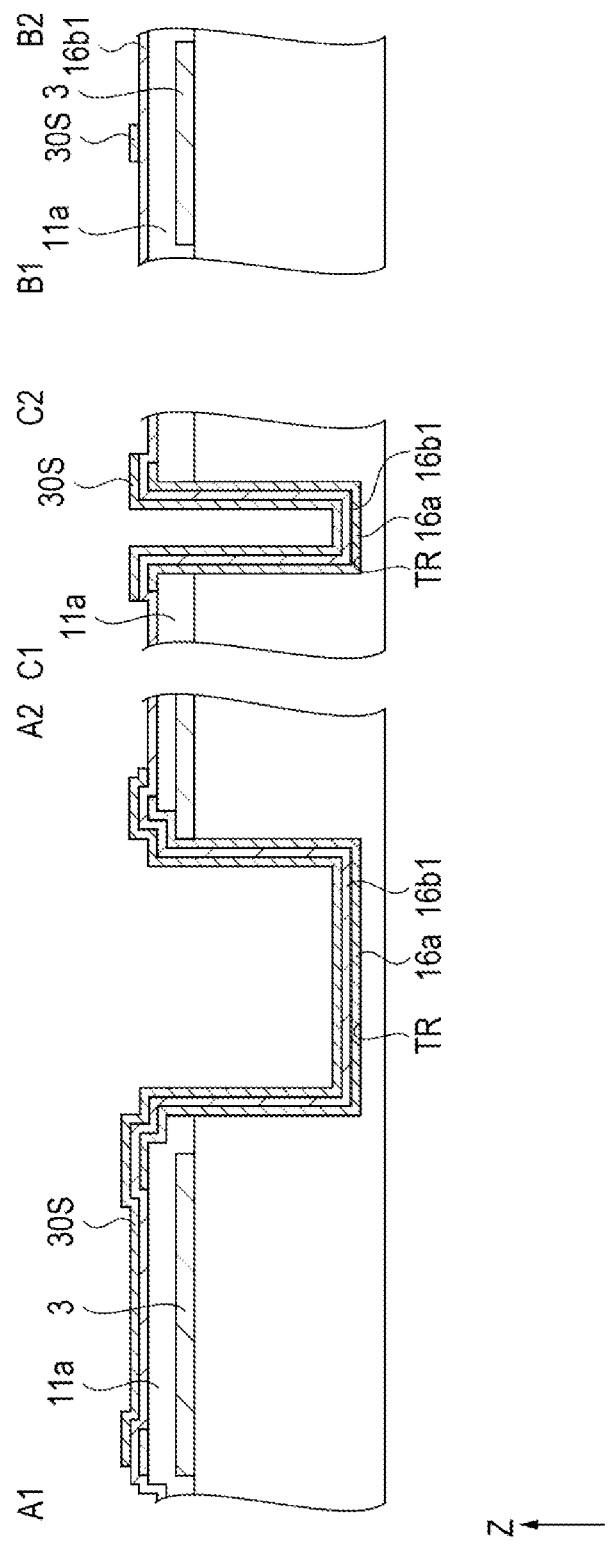
FIG. 11 is a schematic cross-sectional view illustrating the method for manufacturing the element substrate.
Figure 12:
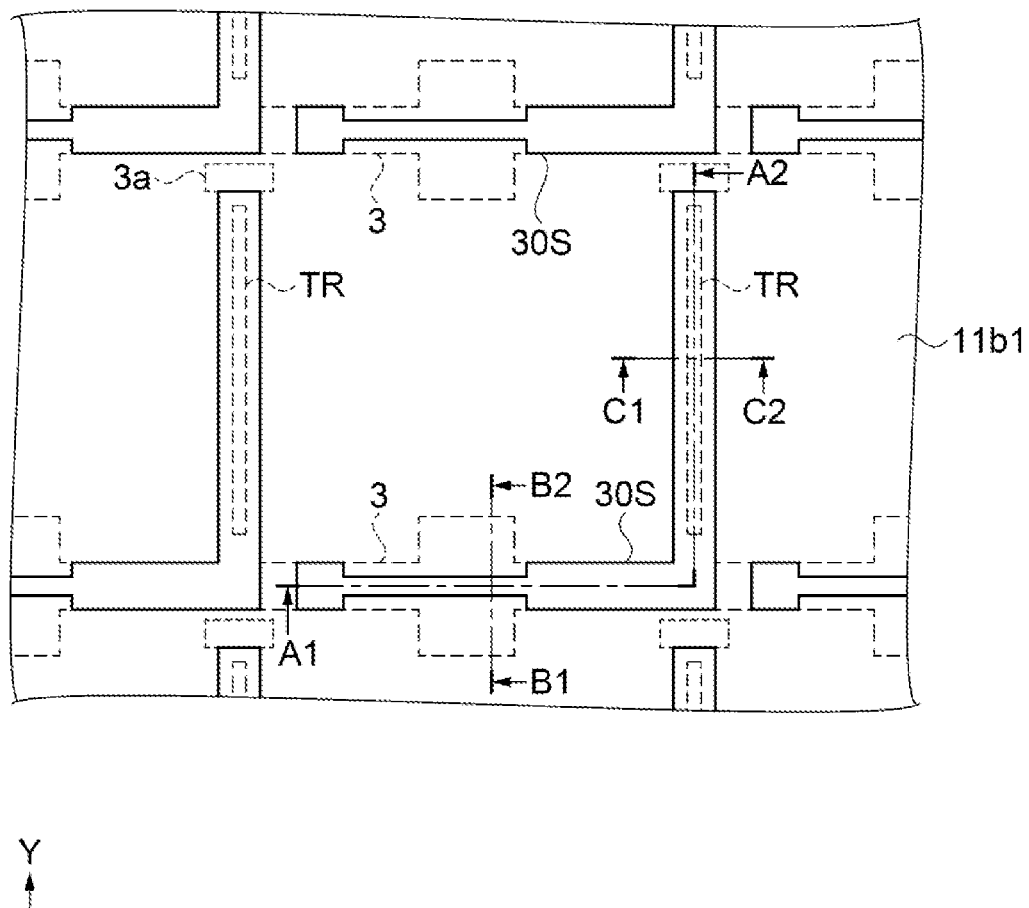
FIG. 12 is a schematic plan view illustrating the method for manufacturing the element substrate.

In step S3, as illustrated in FIG. 11 and FIG. 12, a polysilicon layer is provided at the insulating layer 16b1 including the inside of the trench TR. The polysilicon layer is an amorphous polysilicon film, and is formed using a low-pressure CVD method, or the like. The polysilicon layer is patterned to provide the semiconductor layer 30S.

The semiconductor layer 30S is provided bent in the ±Y directions from the ±X directions. Although not illustrated, the semiconductor layer 30S is disposed overlapping the closed region CL. Then the processing proceeds to step S4.

Figure 13:
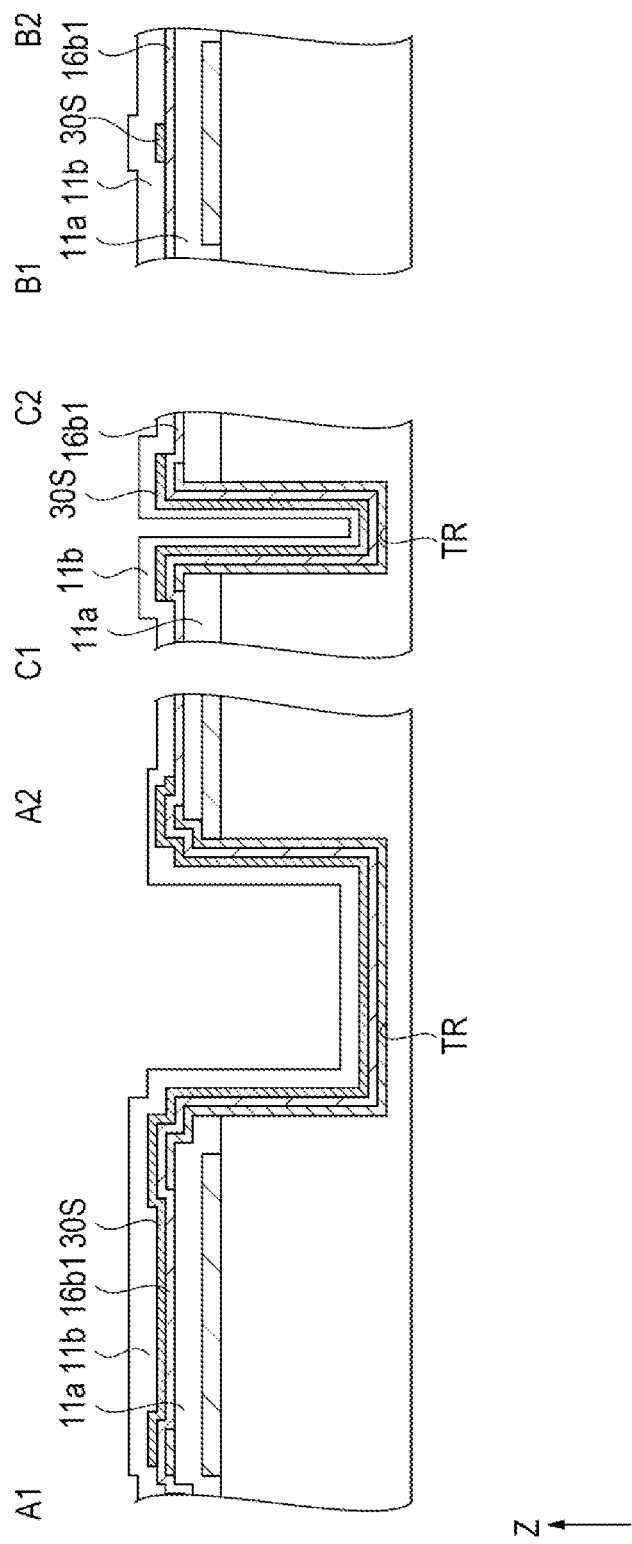
FIG. 13 is a schematic cross-sectional view illustrating the method for manufacturing the element substrate.
Figure 14:
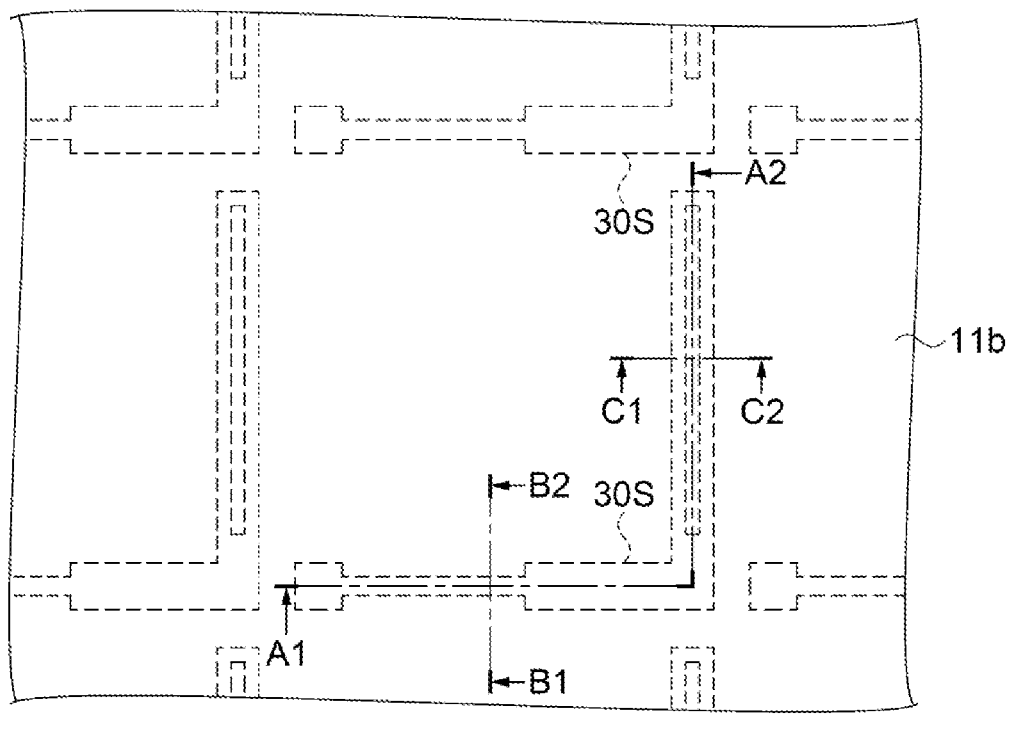
FIG. 14 is a schematic plan view illustrating the method for manufacturing the element substrate.
Figure 14:
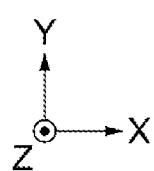

In step S4, as illustrated in FIG. 13 and FIG. 14, the gate insulating layer 11b is provided in a solid form at the semiconductor layer 30S. When, for example, double structure formed of two types of silicon oxide is employed for the gate insulating layer 11b, a first silicon oxide film obtained by thermal oxidation of a polysilicon film is provided, and then a second silicon oxide film is provided under high temperature conditions from 700° C. to 900° C. using a low-pressure CVD method. At this time, the inside of the trench TR is also covered with the gate insulating layer 11b. Then the processing proceeds to step S5.

Figure 15A:
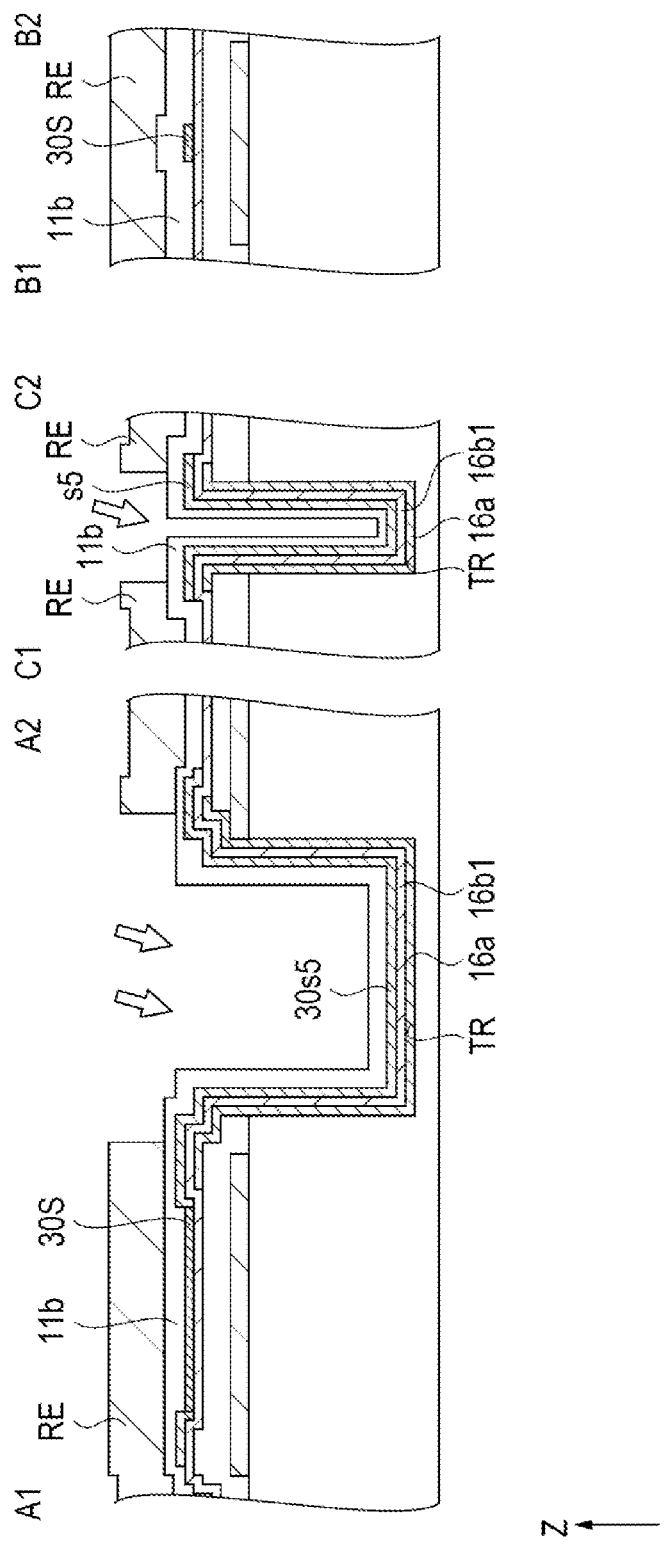
FIG. 15A is a schematic cross-sectional view illustrating the method for manufacturing the element substrate.
Figure 15B:
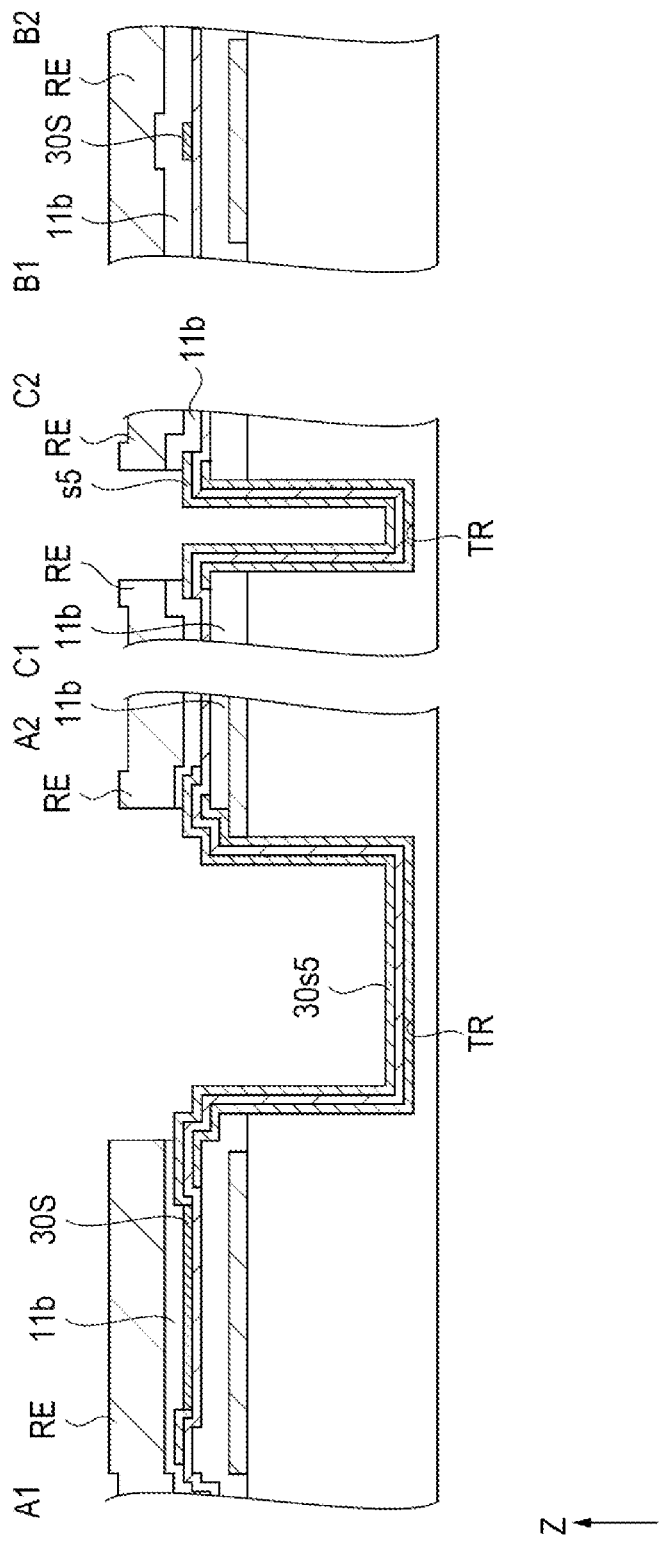
FIG. 15B is a schematic cross-sectional view illustrating the method for manufacturing the element substrate.
Figure 16:
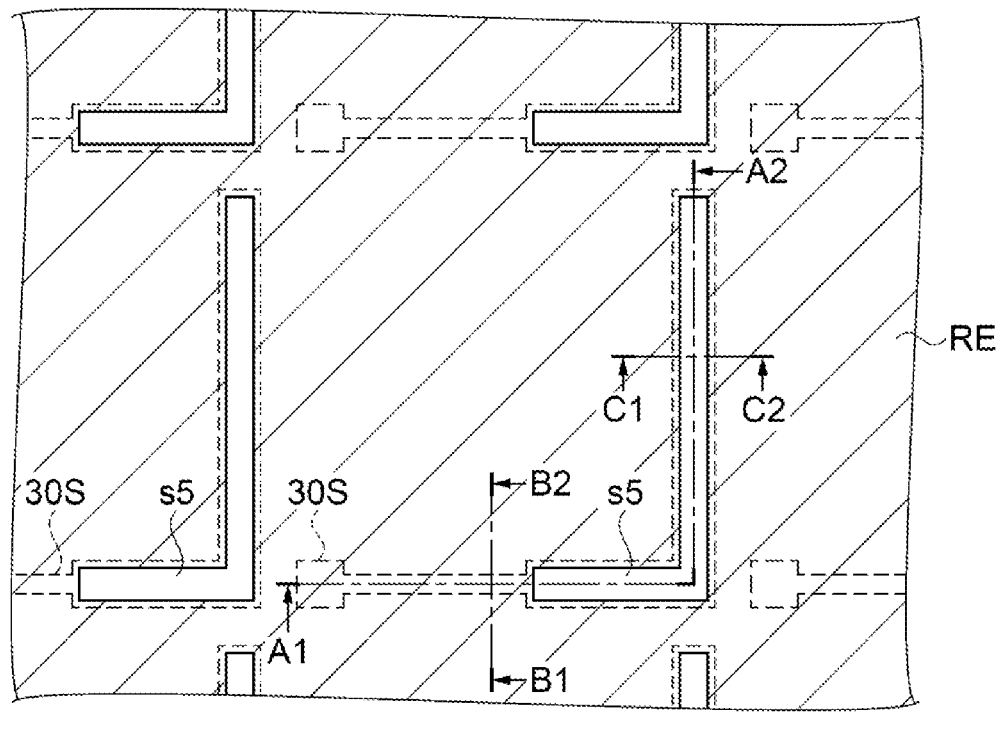
FIG. 16 is a schematic plan view illustrating the method for manufacturing the element substrate.
Figure 16:
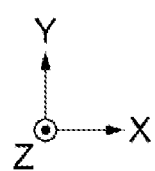

In step S5, as illustrated in FIG. 15A, FIG. 15B, and FIG. 16, the other source drain region s5, which is the common capacitance electrode for the first capacitance element 16A and the second capacitance element 16B is formed. First, as illustrated in FIG. 16, a resist RE is formed in a region excluding the inside of the trench TR and an edge of the trench TR. The region where the resist RE is not disposed corresponds to the second capacitance electrode 30s5, which functions as the common capacitance electrode, of the other source drain region s5 of the semiconductor layer 30S.

Next, ion injection is performed in the semiconductor layer 30S. First, electrical conductivity is given to the semiconductor layer 30S in the inside of the trench TR and at the edge of the trench TR, and the first capacitance electrode 16a, which are the regions where the resist RE is not disposed. At this time, an ion as an impurity is injected into the above semiconductor layer 30S via the gate insulating layer 11b. Additionally, an ion is injected into the first capacitance electrode 16a via the insulating layer 16b1. As a result, as illustrated in FIG. 15A, the semiconductor layer 30S in the inside of the trench TR and at the edge of the trench TR becomes the other source drain region s5. Additionally, electrical conductivity is given to the first capacitance electrode 16a. The ion injected is, for example, phosphorus (P).

Next, as illustrated in FIG. 15B, the gate insulating layer 11b in the inside of the trench TR and at the edge of the trench TR on which the resist RE is not disposed is removed by wet etching. Thereafter, all the resist RE is removed. Then the processing proceeds to step S6.

Figure 17:
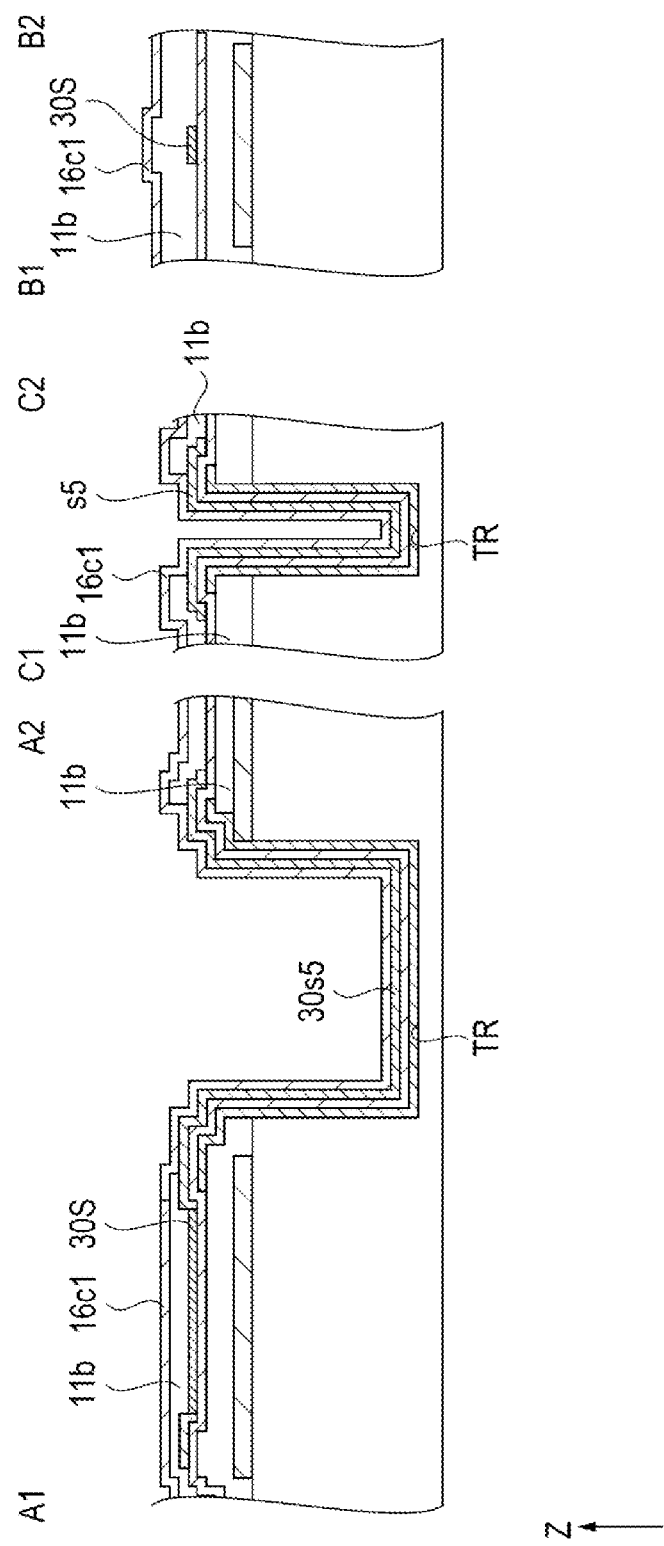
FIG. 17 is a schematic cross-sectional view illustrating the method for manufacturing the element substrate.
Figure 18:
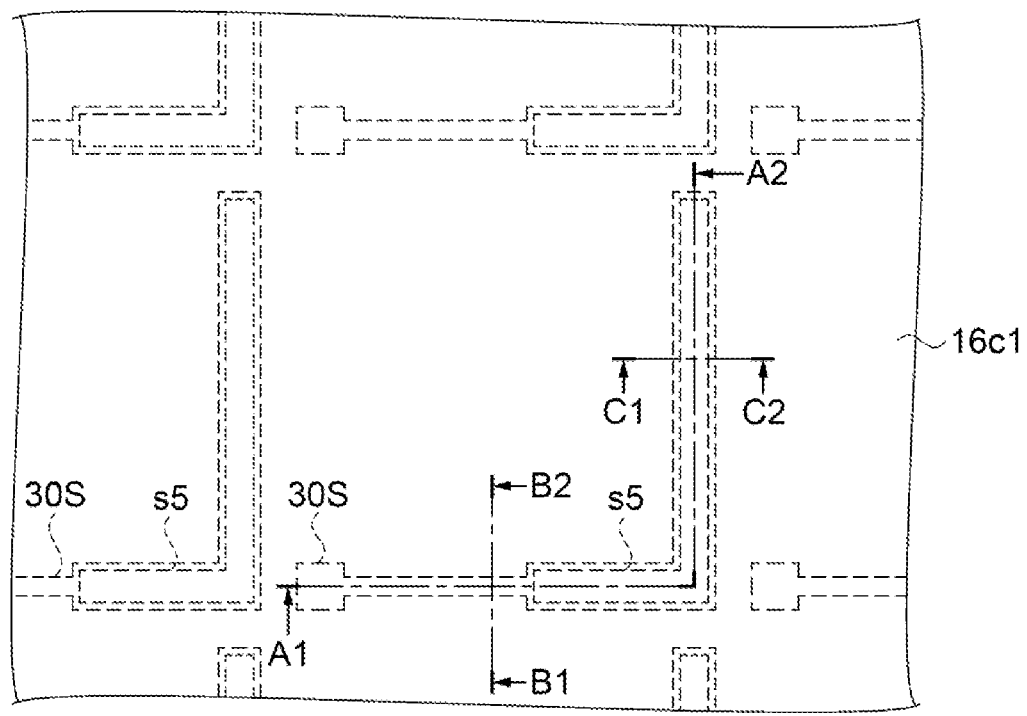
FIG. 18 is a schematic plan view illustrating the method for manufacturing the element substrate.

In step S6, as illustrated in FIG. 17 and FIG. 18, an insulating layer 16c1 is formed. The insulating layer 16c1 is a layer that becomes the second capacitor insulating layer 16c in the subsequent step. Specifically, the insulating layer 16c1 is provided in a solid form at the other source drain region s5 in the inside of the trench TR and at the edge of the trench TR, and at the gate insulating layer 11b. Specifically, the insulating layer 16c1 is provided by a low-pressure CVD method, a plasma CVD method, or the like using silicon nitride. Then the processing proceeds to step S7.

Figure 19A:
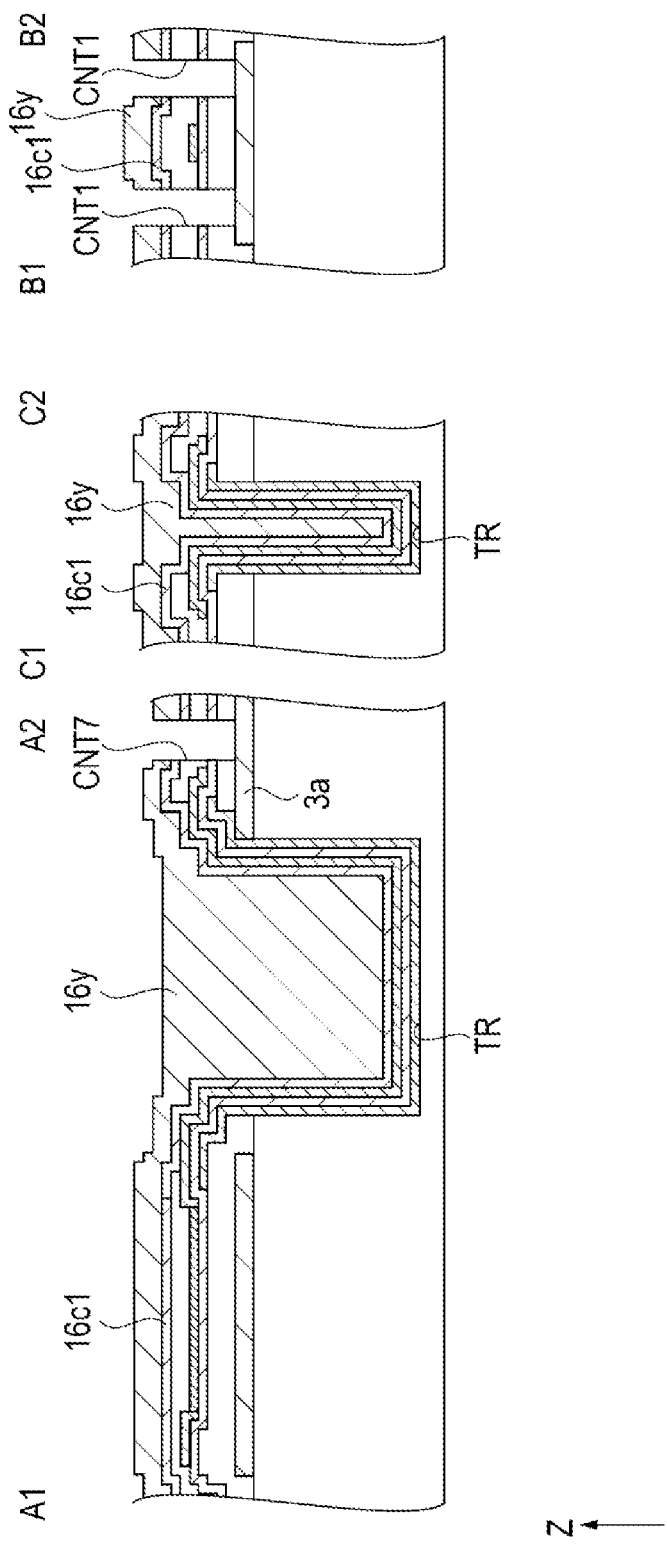
FIG. 19A is a schematic cross-sectional view illustrating the method for manufacturing the element substrate.
Figure 19B:
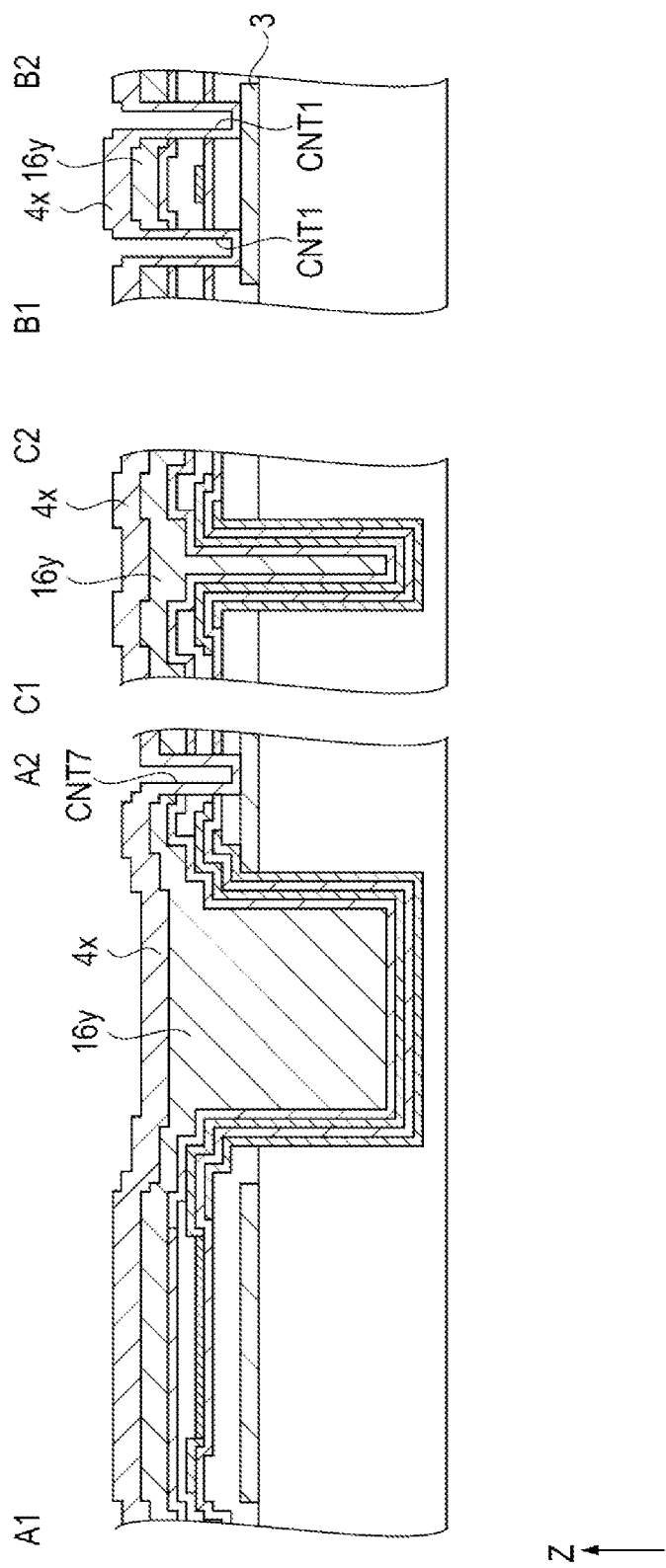
FIG. 19B is a schematic cross-sectional view illustrating the method for manufacturing the element substrate.
Figure 20:
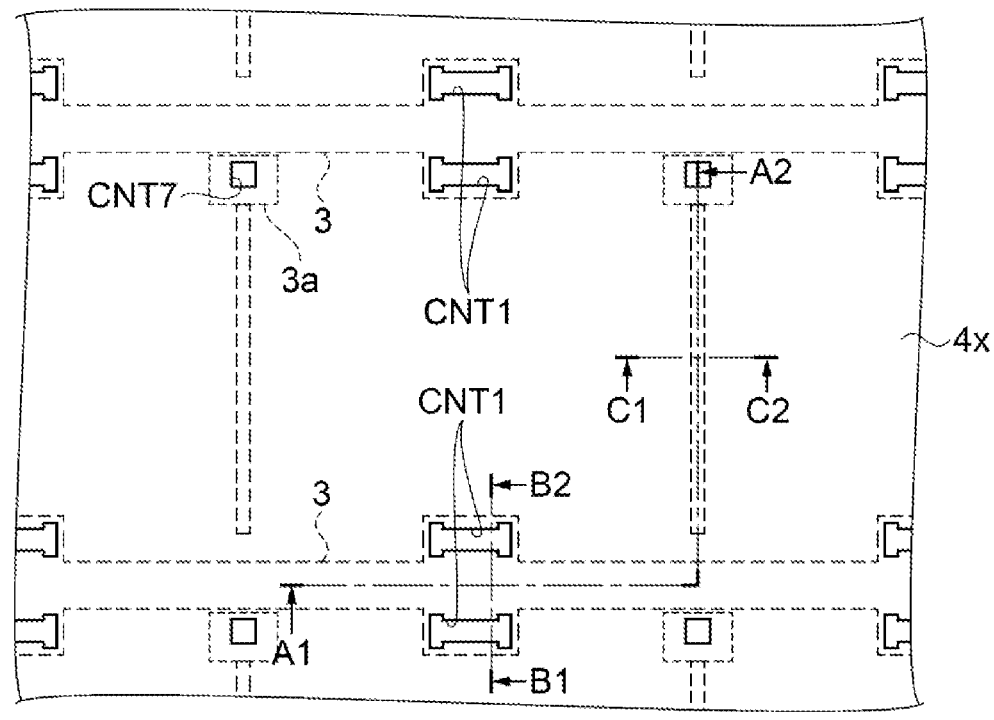
FIG. 20 is a schematic plan view illustrating the method for manufacturing the element substrate.
Figure 20:
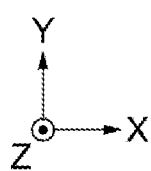

In step S7, as illustrated in FIG. 19A, FIG. 19B, and FIG. 20, a second conductive layer 16y and a third conductive layer 4x are formed. The second conductive layer 16y is a layer that becomes the first gate electrode g1 and the third capacitance electrode 16d in the subsequent step. The third conductive layer 4x is a layer that becomes the second gate electrode g2 and the third capacitance electrode 4 in the subsequent step.

First, the second conductive layer 16y is provided in a solid form at the insulating layer 16c1. Specifically, after a polycrystalline silicon film is provided by a low-pressure CVD method, phosphorus is injected into the polycrystalline silicon film, and then diffused to form a conductive polysilicon film. Concentration of the phosphorus atoms in the second conductive layer 16y is $1 \times 10^{19}$ pieces/cm$^3$ or greater. At this time, the trench TR needs to be filled up with the second conductive layer 16y.

Next, the pair of second contact holes CNT1 that face each other in the ±Y directions sandwiching the semiconductor layer 30S are provided. The pair of second contact holes CNT1 penetrate the second conductive layer 16y, the insulating layer 16c1, the gate insulating layer 11b, and the first interlayer insulating layer 11a, and reach the scanning line 3. Furthermore, a second contact hole CNT7 to expose a part of the relay electrode 3a is provided. The second contact hole CNT7 penetrates the second conductive layer 16y, the insulating layer 16c1, the gate insulating layer 11b, and the first interlayer insulating layer 11a, and reaches the relay electrode 3a. For example, dry etching is used to form the pair of second contact holes CNT1 and the second contact hole CNT7.

Next, the third conductive layer 4x is provided in a solid form at the second conductive layer 16y, and in the pair of second contact holes CNT1, and the second contact hole CNT7. At this time, the third conductive layer 4x is electrically coupled to the scanning line 3. Furthermore, the third conductive layer 4x is electrically coupled to the relay electrode 3a. As a result, the first capacitance electrode 16a and the third capacitance electrode 16d formed in the subsequent step are electrically coupled via the relay electrode 3a and the second contact hole CNT7. Then the processing proceeds to step S8.

Figure 21:
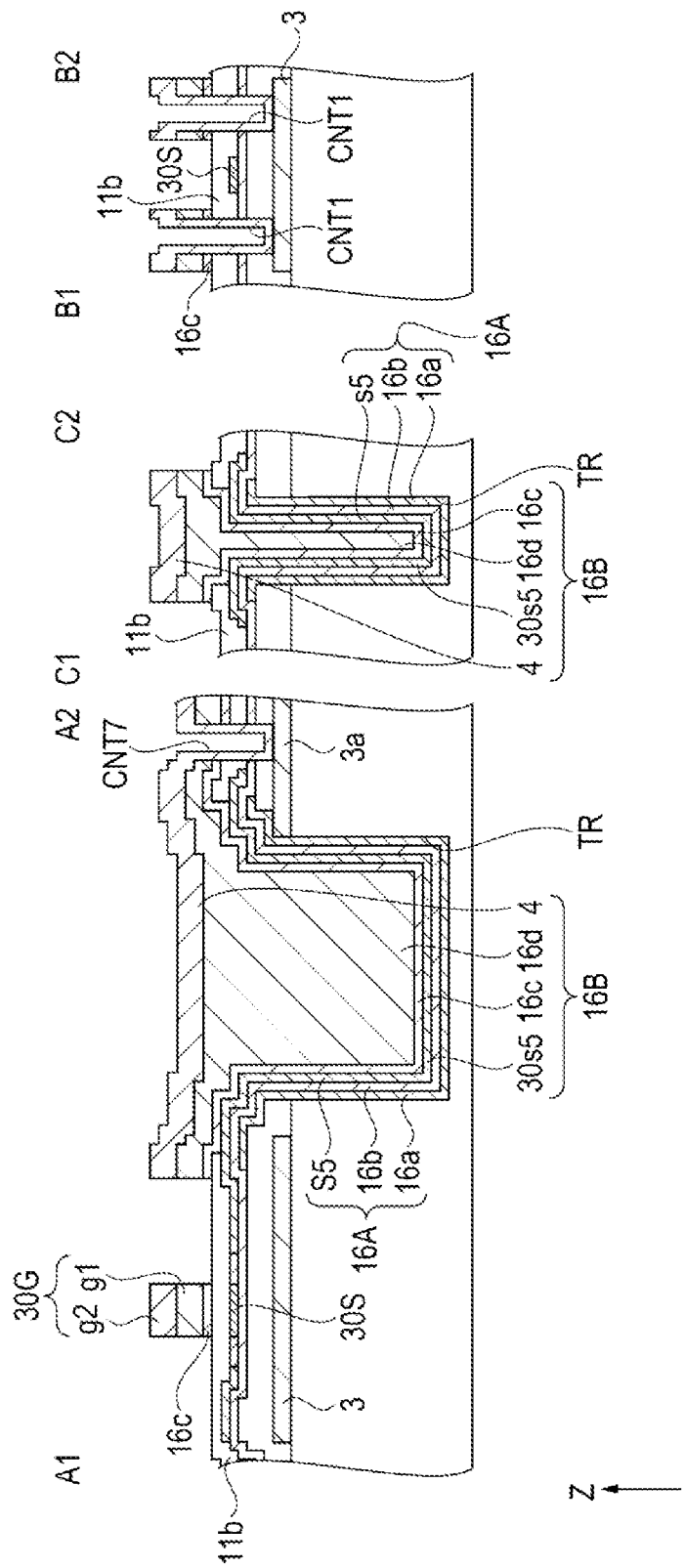
FIG. 21 is a schematic cross-sectional view illustrating the method for manufacturing the element substrate.

In step S8, as illustrated in FIG. 21, the gate electrode 30G, and the like are formed. Specifically, the insulating layer 16c1, the second conductive layer 16y, and the third conductive layer 4x are patterned using dry etching.

As a result, the gate electrode 30G including the first gate electrode g1 and the second gate electrode g2 is provided at the gate insulating layer 11b. At this time, in plan view, the insulating layer 16c1 of silicon nitride is removed in a region other than the gate electrode 30G and the third capacitance electrode 4. In other words, in a region on the semiconductor layer 30S that does not overlap the gate electrode 30G of the semiconductor layer 30S and the second capacitor insulating layer 16c below the gate electrode 30G, silicon nitride is not provided. This facilitates hydrogenation in the semiconductor layer 30S.

By the patterning described above, the second capacitance element 16B constituted by the second capacitance electrode 30s5, which is a part of the other source drain region s5, the second capacitor insulating layer 16c, and the third capacitance electrode 16d, and the third capacitance electrode 4 is also provided.

As illustrated in FIG. 22, the gate electrode 30G is disposed in an island shape in plan view, and includes a part overlapping the pair of second contact holes CNT1, and a part (not illustrated) overlapping the semiconductor layer 30S.

The third capacitance electrode 4 is provided extending in the ±Y directions so as to overlap the closed region CL extending in the ±Y directions. The third capacitance electrode 4 has a main body portion 4a that overlaps the data line 6 provided above and extends in the ±Y directions, and a protruding portion 4b that protrudes in the −X direction from the main body portion 4a. The protruding portion 4b overlaps a part of the semiconductor layer 30S extending in the ±X directions. A part of the second capacitor insulating layer 16c and the third capacitance electrode 16d is disposed overlapping the third capacitance electrode 4. Then the processing proceeds to step S9.

Figure 23:
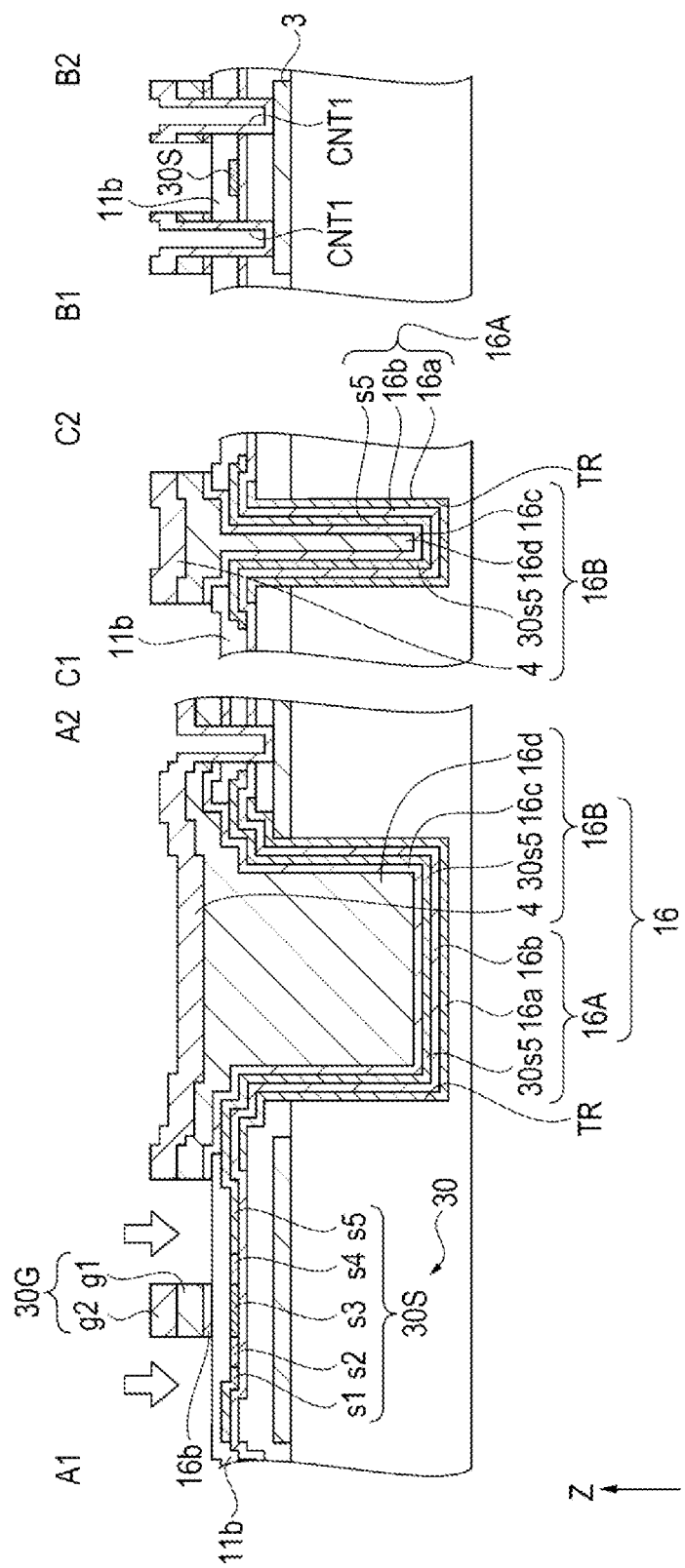
FIG. 23 is a schematic cross-sectional view illustrating the method for manufacturing the element substrate.
Figure 24:
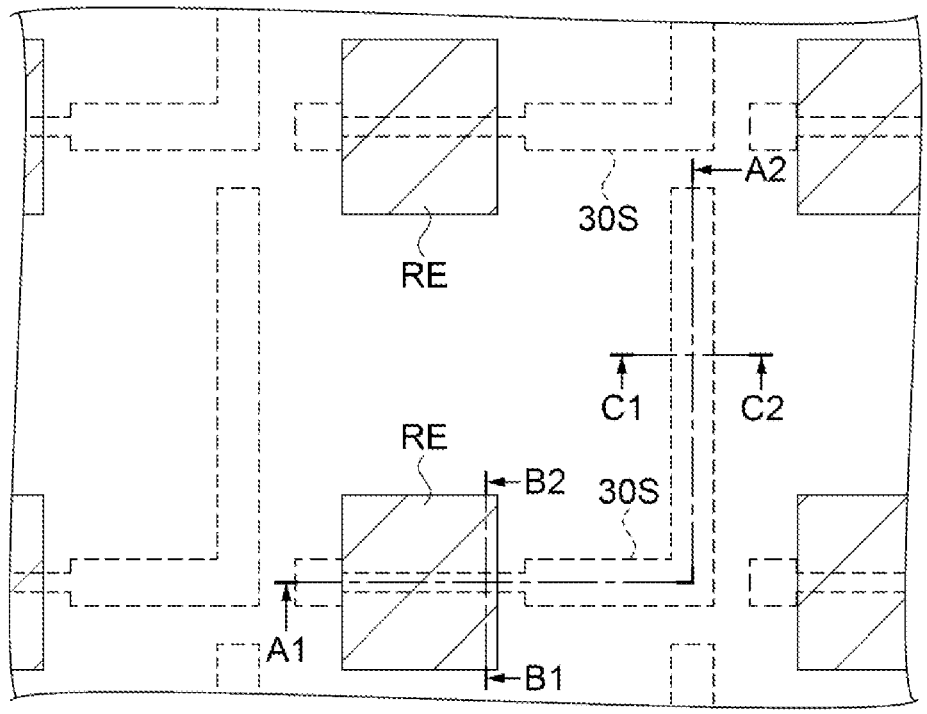
FIG. 24 is a schematic plan view illustrating the method for manufacturing the element substrate.
Figure 24:
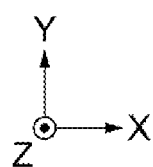

In step S9, as illustrated in FIG. 23, the one source drain region s1, the LDD regions s2, s4, the channel region s3, and a part of the other source drain region s5 are formed at the semiconductor layer 30S by ion injection. Specifically, injection of medium concentration ion and subsequent injection of high concentration ion are performed in the semiconductor layer 30S.

First, the LDD regions s2 and s4 are provided that sandwiches the channel region s3 in the ±X directions, by the injection of medium concentration ion. Next, the LDD regions s2, s4 and the channel region s3 of the semiconductor layer 30S are masked with a pattern of the resist RE illustrated in FIG. 24, and the injection of high concentration ion is performed into the semiconductor layer 30S other than those. This provides the source drain regions s1 and s5. Then the processing proceeds to step S10.

In step S10, the second interlayer insulating layer 11c and the like are formed. First, the second interlayer insulating layer 11c is provided at the second gate electrode g2, the third capacitance electrode 4, and the gate insulating layer 11b exposed upward. Examples of a method for forming silicon oxide that is the second interlayer insulating layer 11c include an atmospheric pressure CVD method, a low-pressure CVD method, a plasma CVD method, or the like using, for example, monosilane, dichlorosilane, TEOS, TEB (Triethyl Borate), and the like.

Impurity activation annealing is then performed by heating at about 1000° C. Hydrogen plasma treatment is then performed. As a result, defects in the semiconductor layer 30S are terminated with hydrogen, and characteristics of the switching element are improved.

Figure 25:
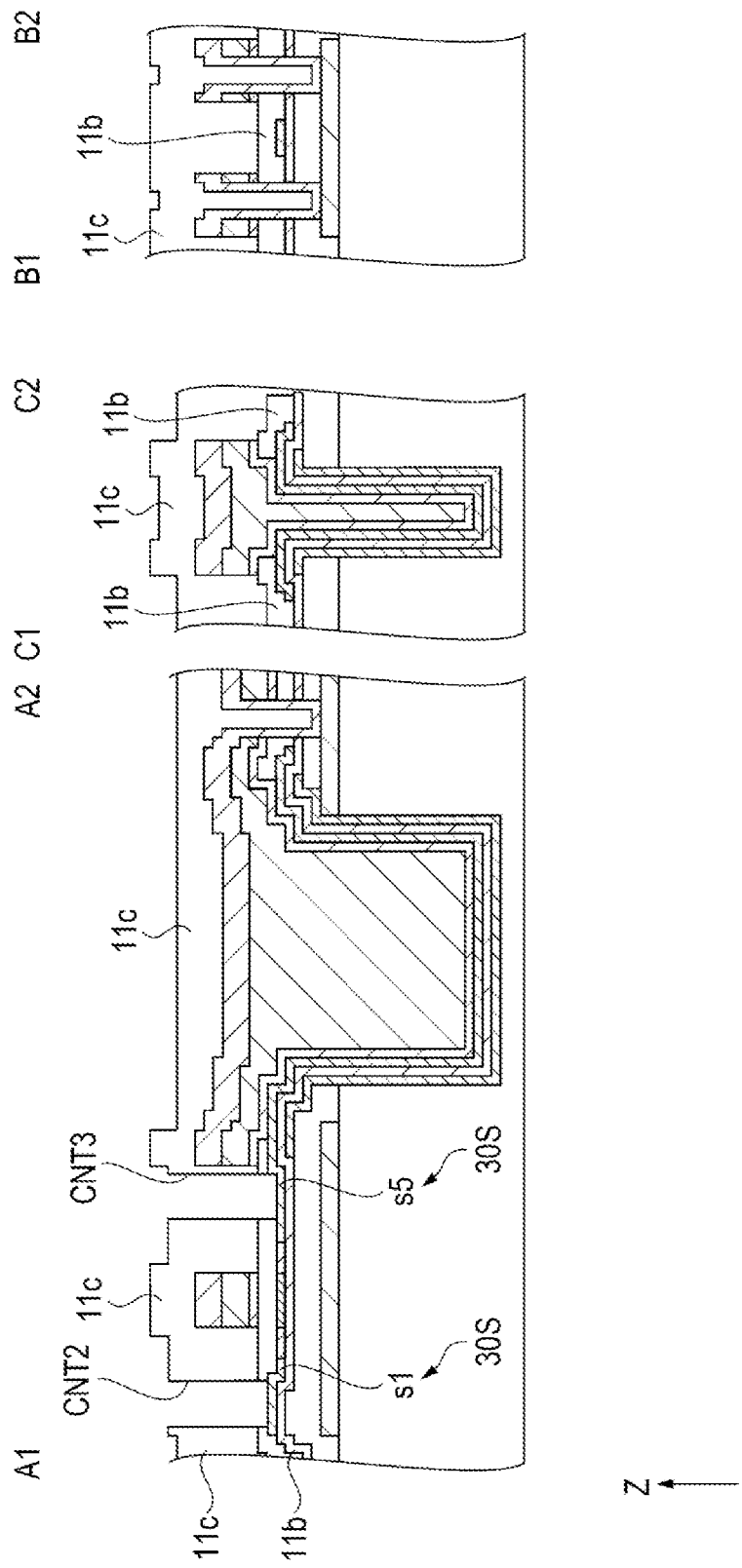
FIG. 25 is a schematic cross-sectional view illustrating the method for manufacturing the element substrate.
Figure 26:
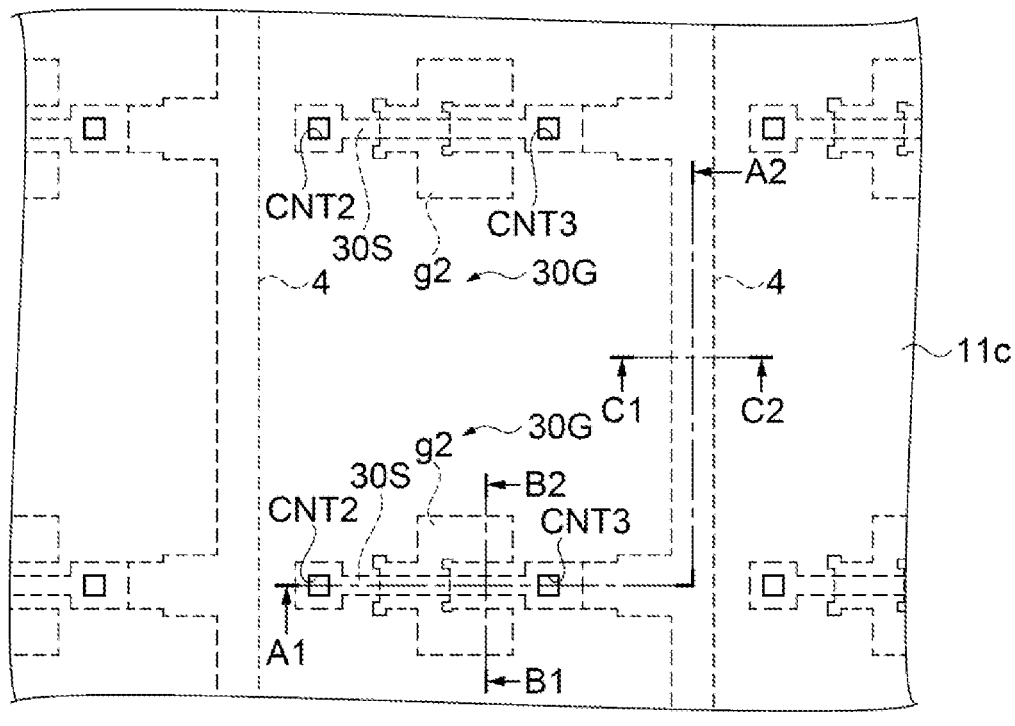
FIG. 26 is a schematic plan view illustrating the method for manufacturing the element substrate.

Next, as illustrated in FIG. 25 and FIG. 26, the contact holes CNT2 and CNT3 are formed by dry etching. The contact holes CNT2 and CNT3 penetrate the gate insulating layer 11b and the second interlayer insulating layer 11c, and reach the semiconductor layer 30S. In plan view, the contact hole CNT2 overlaps the one source drain region s1, and the contact hole CNT3 overlaps a part of the other source drain region s5 that is adjacent to the LDD region s4. Then the processing proceeds to step S11.

Figure 27:
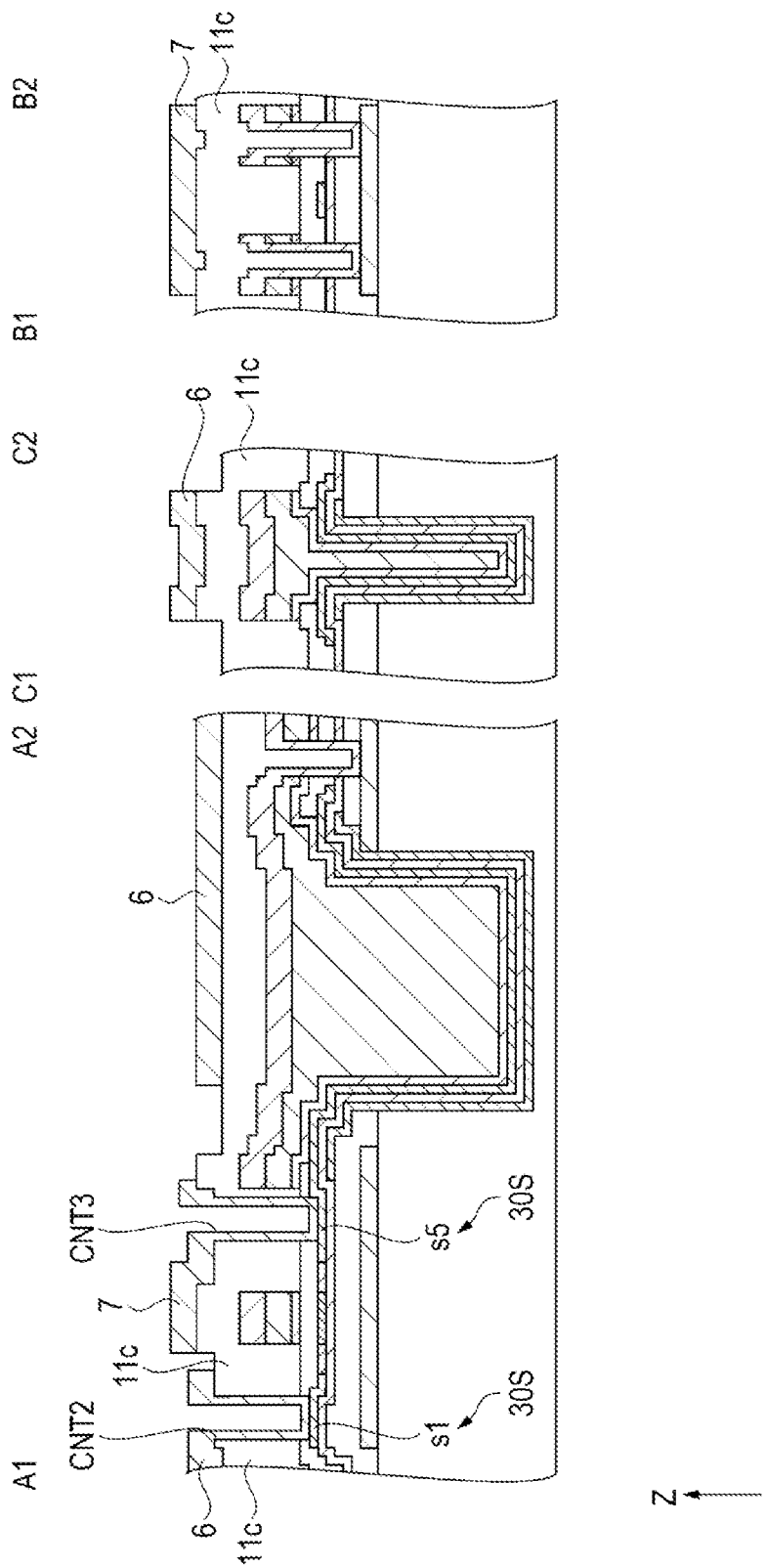
FIG. 27 is a schematic cross-sectional view illustrating the method for manufacturing the element substrate.

In step S11, the data line 6 and the second relay layer 7 are formed. At this time, as illustrated in FIG. 27, the data line 6 and the second relay layer 7 are provided so as to fill the contact holes CNT2 and CNT3, respectively.

Figure 28:
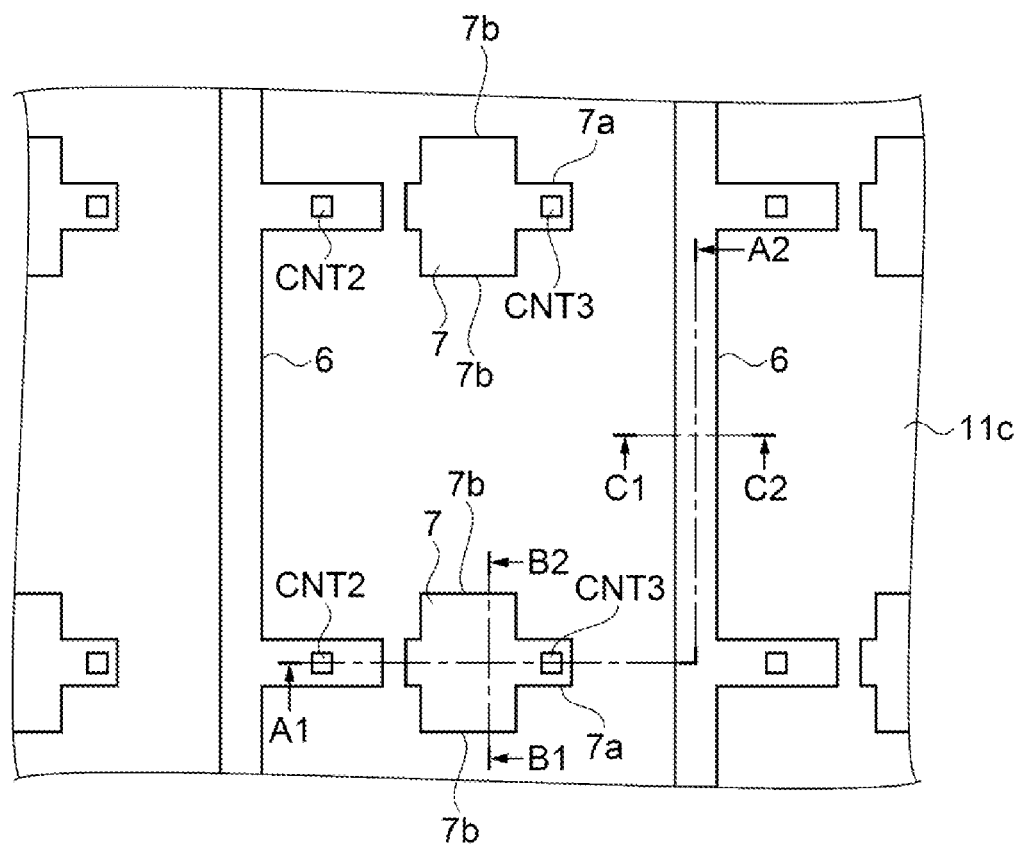
FIG. 28 is a schematic plan view illustrating the method for manufacturing the element substrate.

As illustrated in FIG. 28, the data line 6 is provided extending in the ±Y directions, and overlaps a part (not illustrated) extending in the ±Y directions of the other source drain region s5. In other words, the data line 6 is provided extending in the ±Y directions so as to overlap the trench TR, the first capacitance element 16A, and the second capacitance element 16B in plan view. The data line 6 has a part protruding in the +X direction that overlaps the closed region CL extending in the ±X directions. The contact hole CNT2 is provided in the part.

The second relay layer 7 is provided in an island shape independent of the data line 6. The second relay layer 7 has a main body portion 7a that extends in the ±X directions and overlaps a part of the semiconductor layer 30S below, and a protruding portion 7b that protrudes in the ±Y directions from the main body portion 7a.

The data line 6 and the one source drain region s1 of the semiconductor layer 30S are electrically coupled via the contact hole CNT2. The second relay layer 7 and the other source drain region s5 of the semiconductor layer 30S are electrically coupled via the contact hole CNT3. Then, the processing proceeds to step S12.

In step S12, an upper layer of the data line 6 is formed. First, the third interlayer insulating layer 12 is provided in a solid form, at the data line 6, the second relay layer 7, and the second interlayer insulating layer 11c exposed upward. The third interlayer insulating layer 12 is provided, for example, by a plasma CVD method using a silicon oxide film.

Figure 29:
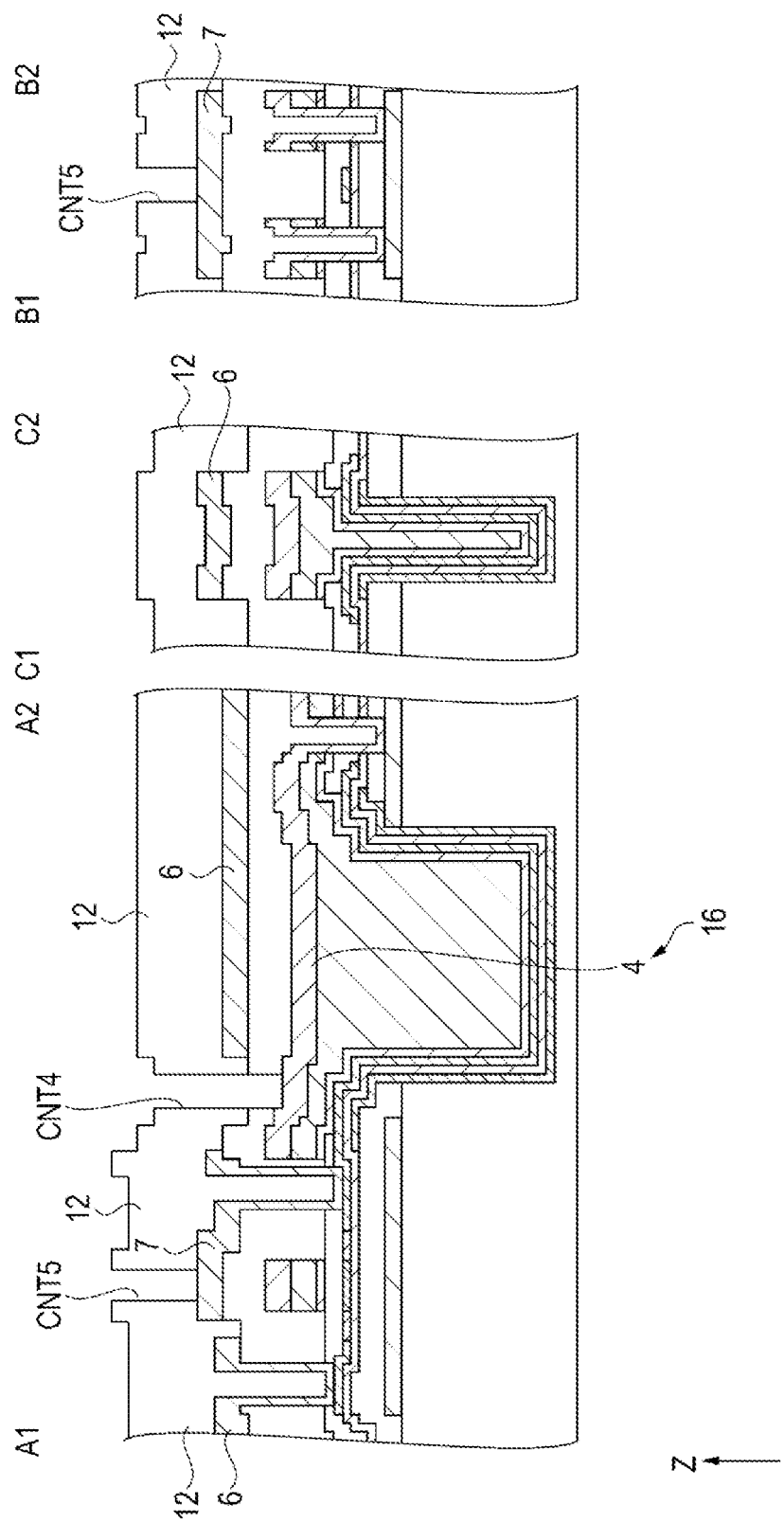
FIG. 29 is a schematic cross-sectional view illustrating the method for manufacturing the element substrate.
Figure 30:
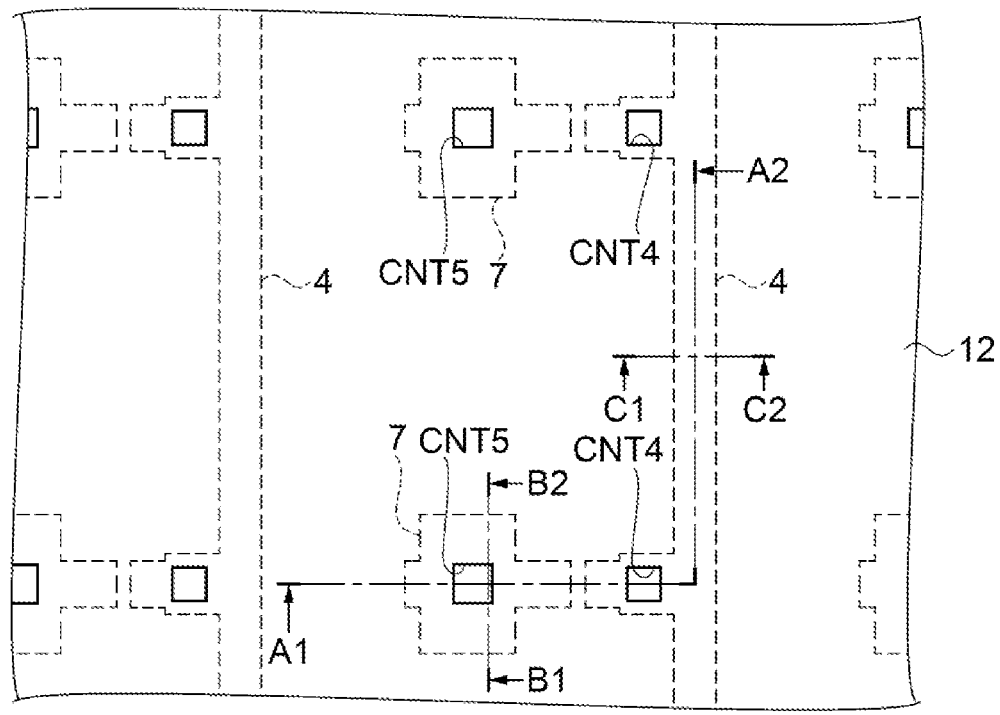
FIG. 30 is a schematic plan view illustrating the method for manufacturing the element substrate.

Next, as illustrated in FIG. 29 and FIG. 30, the contact holes CNT4 and CNT5 are provided by dry etching. The contact hole CNT4 penetrates the third interlayer insulating layer 12 and the second interlayer insulating layer 11c, and reaches the third capacitance electrode 4 of the second capacitance element 16B. The contact hole CNT5 penetrates the third interlayer insulating layer 12 and reaches the second relay layer 7.

Figure 31:
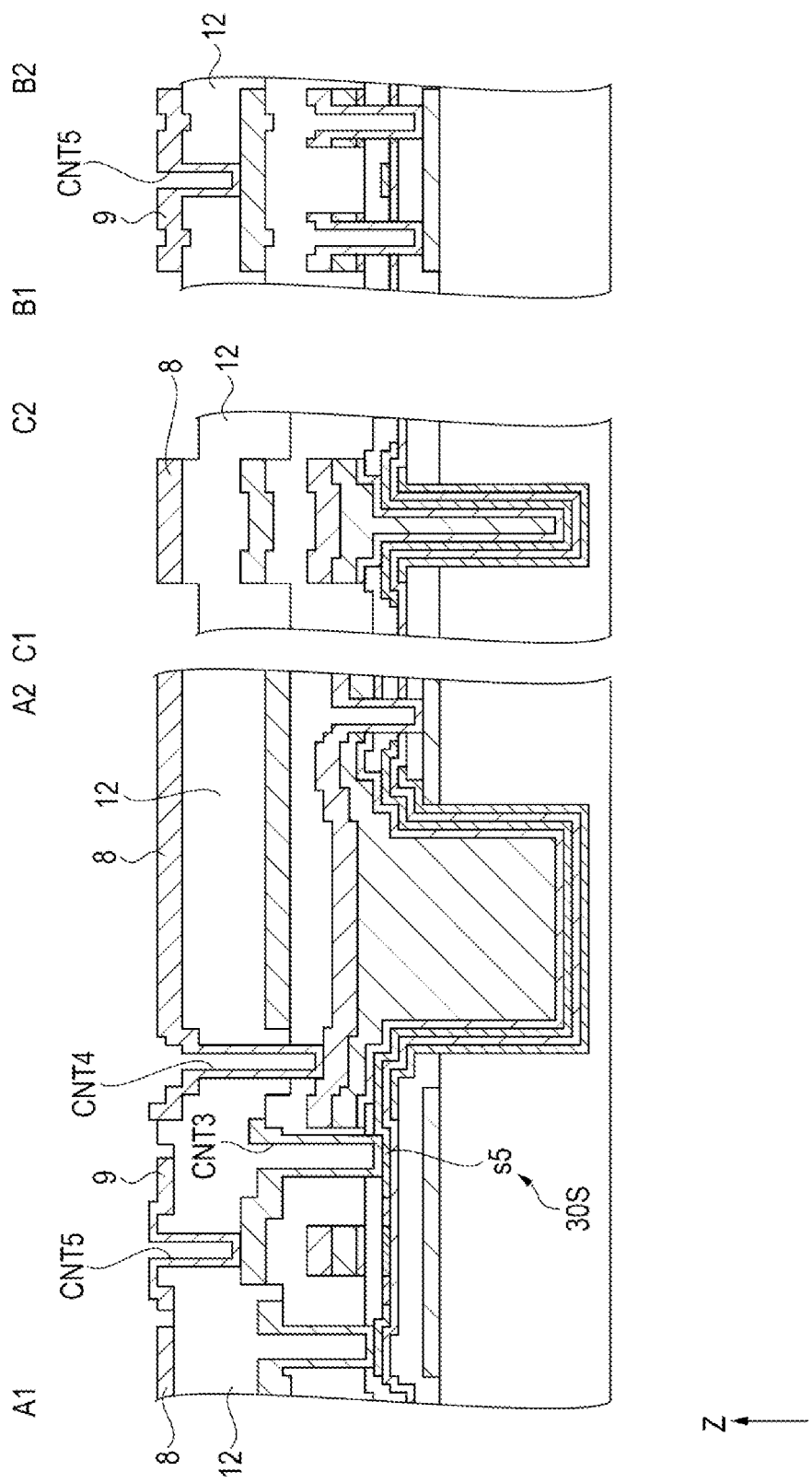
FIG. 31 is a schematic cross-sectional view illustrating the method for manufacturing the element substrate.

Next, the capacitance line 8 and the first relay layer 9 are formed. At this time, as illustrated in FIG. 31, the capacitance line 8 and the first relay layer 9 are provided so as to fill the contact holes CNT4 and CNT5, respectively.

The capacitance line 8 is electrically coupled to the third capacitance electrode 4 and the third capacitance electrode 16d via the contact hole CNT4. The first relay layer 9 is electrically coupled to the other source drain region s5 of the semiconductor layer 30S, via the contact hole CNT5, the second relay layer 7, and the contact hole CNT3.

Figure 32:
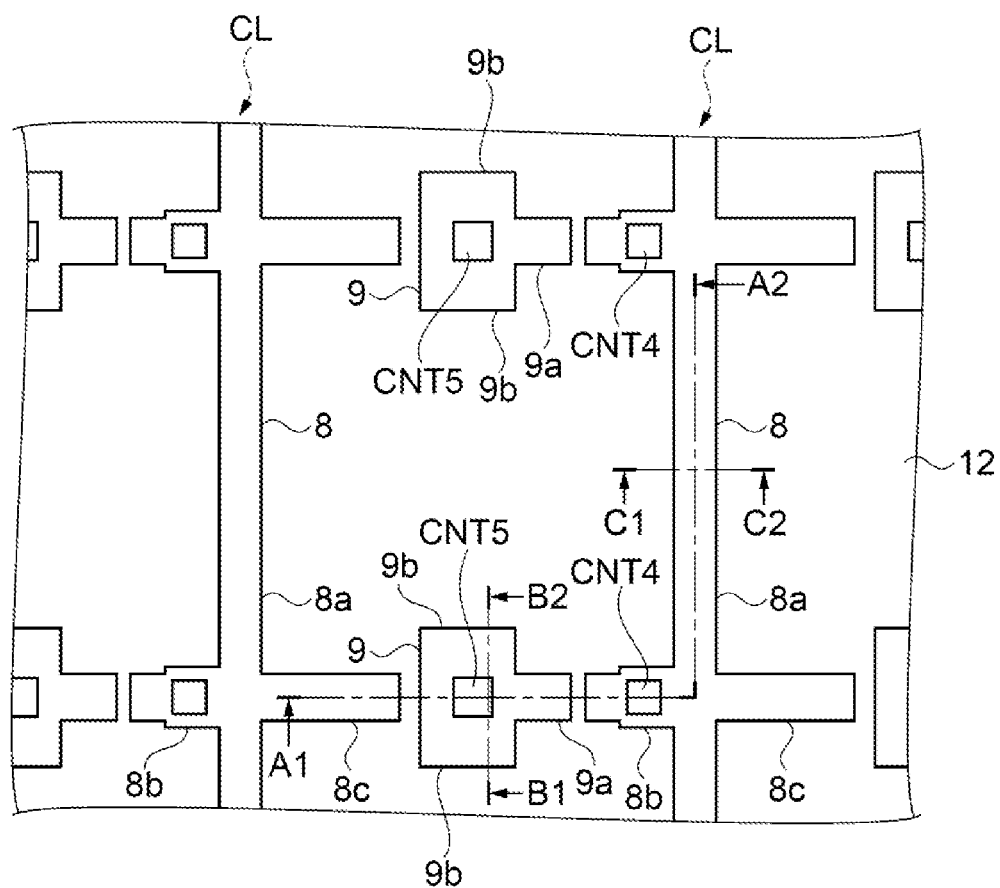
FIG. 32 is a schematic plan view illustrating the method for manufacturing the element substrate.

As illustrated in FIG. 32, the capacitance line 8 is provided extending in the ±Y directions so as to overlap the closed region CL extending in the ±Y directions. The capacitance line 8 has a main body portion 8a that overlaps the data line 6 provided below, and extends in the ±Y directions, a protruding portion 8b protruding in the −X direction from the main body portion 8a, and another protruding portion 8c protruding from the main body 8a in the +X direction opposite the protruding portion 8b. The protruding portion 8b overlaps a part of the semiconductor layer 30S extending in the ±X directions. The contact hole CNT4 is provided in the protruding portion 8b. The other protruding portion 8c overlaps another semiconductor layer 30S (not illustrated) that is adjacent to the semiconductor layer 30S in the +X direction.

The first relay layer 9 is provided in an island shape independent of the capacitance line 8, and overlaps the contact hole CNT5. The first relay layer 9 has a main body portion 9a that extends in the ±X directions, and overlaps a part of the semiconductor layer 30S below, and a protruding portion 9b that protrudes in the ±Y directions from the main body portion 9a.

Next, the fourth interlayer insulating layer 13 is provided in a solid form at the capacitance line 8, the first relay layer 9, and the third interlayer insulating layer 12 exposed upward. The fourth interlayer insulating layer 13 is provided, for example, by a plasma CVD method using a silicon oxide film. After the fourth interlayer insulating layer 13 is provided, a planarization process such as a CMP (Chemical & Mechanical Polishing) process is performed to mitigate unevenness caused by underlying structure.

Figure 33:
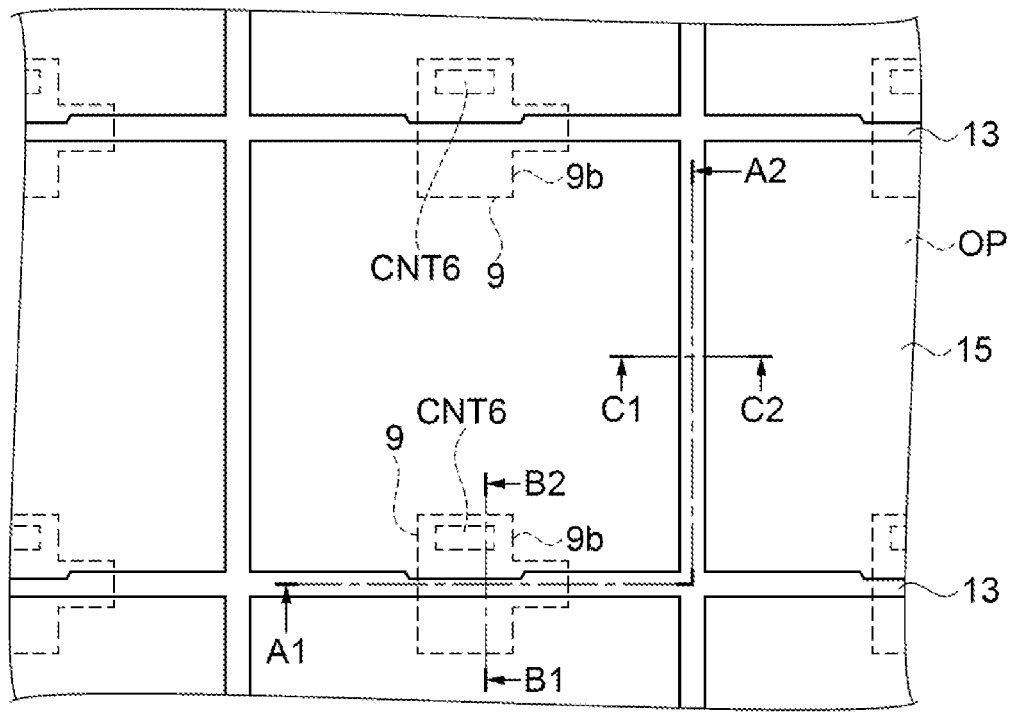
FIG. 33 is a schematic plan view illustrating the method for manufacturing the element substrate.
Figure 33:
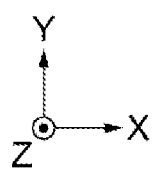

Next, the first contact hole CNT6 is provided that penetrates the fourth interlayer insulating layer 13 to expose the first relay layer 9 by dry etching. Thereafter, as illustrated in FIG. 33, the pixel electrode 15 corresponding to the opening region OP is provided at the fourth interlayer insulating layer 13. At this time, the pixel electrode 15 is provided so as to fill the first contact hole CNT6. As a result, the pixel electrode 15 is electrically coupled to the other source drain region s5 of the semiconductor layer 30S, via the first contact hole CNT6, the first relay layer 9, the contact hole CNT5, the second relay layer 7, and the contact hole CNT3.

Of the method for manufacturing the element substrate 10, known techniques can be employed for subsequent steps, and descriptions thereof will be omitted. According to the method for manufacturing described above, the element substrate 10 and the liquid crystal device 100 are manufactured.

Next, a configuration of a projection-type display device 1000 as an electronic apparatus will be described with reference to FIG. 34.

Figure 34:
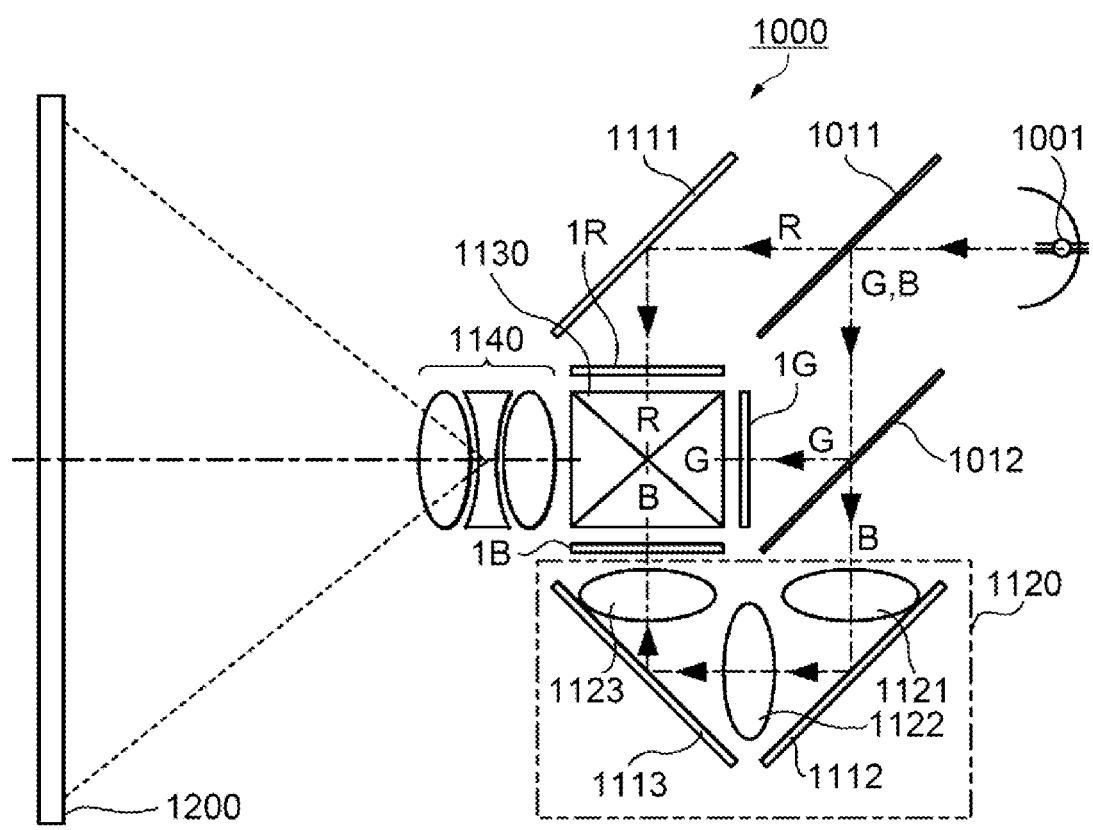
FIG. 34 is a schematic view illustrating a configuration of a projection-type display device as an electronic apparatus.

As illustrated in FIG. 34, the projection-type display device 1000 as an electronic apparatus includes a lamp unit 1001 as a light source, dichroic mirrors 1011, 1012 as a color separation optical system, three liquid crystal devices 1B, 1G, 1R as electro-optical devices, three reflection mirrors 1111, 1112, 1113, three relay lenses 1121, 1122, 1123, a dichroic prism 1130 as a color synthesis optical system, and a projection lens 1140 as a projection optical system.

In the lamp unit 1001, for example, a discharge type light source is employed. The method of the light source is not limited thereto, and a solid light source such as a light emitting diode, a laser, or the like may be employed.

Light emitted from the lamp unit 1001 is separated by the two dichroic mirrors 1011 and 1012 into three colors of colored light with wavelength ranges different from each other. The three colors of colored light include substantially red light, substantially green light, and substantially blue light. In the following description, the substantially red light is also referred to as red light R, the substantially green light is also referred to as green light G, and the substantially blue light is also referred to as blue light B.

The dichroic mirror 1011 transmits the red light R, and reflects the green light G and the blue light B each having a wavelength shorter than that of the red light R. The red light R transmitted through the dichroic mirror 1011 is reflected by the reflection mirror 1111, and is incident on the liquid crystal device 1R. The green light G reflected by the dichroic mirror 1011 is reflected by the dichroic mirror 1012, and is then incident on the liquid crystal device 1G. The blue light B reflected by the dichroic mirror 1011 is transmitted through the dichroic mirror 1012, and is emitted to a relay lens system 1120.

The relay lens system 1120 has relay lenses 1121, 1122, 1123, and reflection mirrors 1112, and 1113. Since a light path of the blue light B is longer compared to the green light G and the red light R, luminous flux tends to increase. Therefore, expansion of the luminous flux is suppressed using the relay lens 1122. The blue light B incident on the relay lens system 1120 is reflected by the reflection mirror 1112 and is converged in a vicinity of the relay lens 1122 by the relay lens 1121. Then, the blue light B is incident on the liquid crystal device 1B, via the reflection mirror 1113 and the relay lens 1123.

The liquid crystal device 100 as an electro-optical device according to the above-described exemplary embodiment is applied to the liquid crystal devices 1R, 1G, and 1B, which are light modulating devices, in the projection-type display device 1000. Additionally, as the liquid crystal devices 1R, 1G, and 1B, a liquid crystal device according to other than the present exemplary embodiment may be applied.

Each of the liquid crystal devices 1R, 1G, and 1B is electrically coupled to an upper circuit of the projection-type display device 1000. As a result, image signals specifying gray scale levels of the red light R, the green light G, and the blue light B are supplied from external circuits, respectively, and are processed by the upper circuit. As a result, the liquid crystal devices 1R, 1G, and 1B are driven, and each colored light is modulated.

The red light R, the green light G, and the blue light B modulated by the respective liquid crystal devices 1R, 1G, and 1B are incident on the dichroic prism 1130 from three directions. The dichroic prism 1130 synthesizes the incident red light R, green light G, and blue light B. In the dichroic prism 1130, the red light R and the blue light B are reflected at 90 degrees, and the green light G is transmitted. Therefore, the red light R, the green light G, and the blue light B are synthesized as display light for displaying a color image, and the display light is emitted toward the projection lens 1140.

The projection lens 1140 is disposed facing an outside of the projection-type display device 1000. The display light is expanded and emitted via the projection lens 1140, and projected onto a screen 1200, which is a projection target.

In the present exemplary embodiment, the projection-type display device 1000 is illustrated as an electronic apparatus, but the electronic apparatus to which the electro-optical device according to the present disclosure is applied is not limited thereto. For example, the electro-optical device according to the present disclosure may be applied to an electronic apparatus such as a projection type HUD (Head-Up Display), a direct view HMD (Head Mounted Display), a personal computer, a digital camera, a liquid crystal television, or the like.

As described above, the liquid crystal device 100 of the present exemplary embodiment includes the scanning line 3 extending in the first direction, the data line 6 extending in the second direction that intersects the first direction, the transistor 30 having the semiconductor layer 30S as the first semiconductor layer disposed at a position overlapping the scanning line 3, and the capacitance element 16 disposed at a position overlapping the data line 6, the capacitance element 16 includes the first capacitance element 16A and the second capacitance element 16B disposed overlapping in plan view, and the first capacitance element 16A and the second capacitance element 16B are configured to include a part of the semiconductor layer 30S.

According to this configuration, since the first capacitance element 16A and the second capacitance element 16B are disposed overlapping along the data line 6, the retention capacitor of the capacitance element 16 can be increased while maintaining a high opening ratio. Accordingly, display quality can be enhanced.

In addition, the liquid crystal device 100 includes the substrate 10s, and the substrate 10s has the trench TR as a recessed portion at a position overlapping the data line 6, and a part of the first capacitance element 16A and a part of the second capacitance element 16B are disposed along the side surface and the bottom surface of the trench TR. According to this configuration, a part of the first capacitance element 16A and the second capacitance element 16B is disposed at the side surface and the bottom surface of the trench TR, and thus the retention capacitor can be increased without increasing an area in plan view, as compared with a case where the capacitance element 16 is disposed at a flat surface. Furthermore, by configuring a part of the first capacitance element 16A and the second capacitance element 16B to overlap, the retention capacitor can be increased without increasing a depth of the trench TR.

Additionally, in the liquid crystal device 100, an ion as an impurity is injected into a part of the semiconductor layer 30S, and the part functions as the common capacitance electrode for the first capacitor element 16A and the second capacitance element 16B (that is, the other source drain region s5). According to this configuration, since the two capacitance elements 16A and 16B have the common capacitance electrode, the number of layered films can be reduced, and processes can be reduced.

Further, in the capacitance element 16, the first capacitance element 16A and the second capacitance element 16B are disposed in order from the substrate 10s side, the first capacitance element 16A is configured to include the first capacitance electrode 16a, the first capacitor insulating layer 16b, and the other source drain region s5 as the second capacitance electrode from the substrate 10s side, the second capacitance element 16B is configured to include the other source drain region s5 as the second capacitance electrode, the second capacitor insulating layer 16c, and the third capacitance electrode 16d from the substrate 10s side, and the other source drain region s5 as the second capacitance electrode is the common capacitance electrode. According to this configuration, a part of the two capacitance elements 16A and 16B is constituted by the other source drain region s5 as the second capacitance electrode, which is the common capacitance electrode, and thus the number of layered films can be reduced, and processes can be reduced. That is, layered parallel capacitors can be easily configured.

Additionally, in the liquid crystal device 100, the first capacitance electrode 16a and the third capacitance electrode 16d are electrically coupled via the relay electrode 3a spaced apart from the scanning line 3, common potential is applied to the first capacitance electrode 16a and the third capacitance electrode 16d, and the second capacitance electrode 30s5 is electrically coupled to the pixel electrode 15. According to this configuration, since the common potential is used for the two electrodes of the first capacitance electrode 16a closest to the substrate 10s, and the third capacitance electrode 16d farthest from the substrate 10s, the configuration can be simplified compared to a case where different potential is supplied to each of the first capacitance electrode 16a and the third capacitance electrode 16d. In addition, the coupling between the second capacitance electrode 30s5 and the pixel electrode 15 is facilitated. In addition, the third capacitance electrodes 16d and 4 are disposed so as to be separated from the gate electrode 30G, so common potential is easily supplied.

In addition, in the liquid crystal device 100, the first capacitance electrode 16a is constituted by the polysilicon layer as the second semiconductor layer. According to this configuration, ions as impurities are simultaneously injected into the two polysilicon layers constituting the first capacitance electrode 16a and the other source drain region s5 as the second capacitance electrode, thus electrodes simultaneously having conductivity can be formed, and can be utilized both for a function as a semiconductor (that is, the TFT 30) and a function as an electrode.

Further, the semiconductor layer 30S as the first semiconductor layer is disposed so as to be coupled along the scanning line 3 and the data line 6. According to this configuration, the semiconductor layer 30S constituting the TFT 30 and the common capacitance electrode constituting the capacitance elements 16A and 16B can be formed with the same layer. Thus, the number of steps in the process can be reduced.

Furthermore, the electronic apparatus of the present exemplary embodiment includes the liquid crystal device 100 described above, and thus, an electronic apparatus capable of improving display quality can be provided.

A modified example of the above-described exemplary embodiment will be described below.

Figure 35:
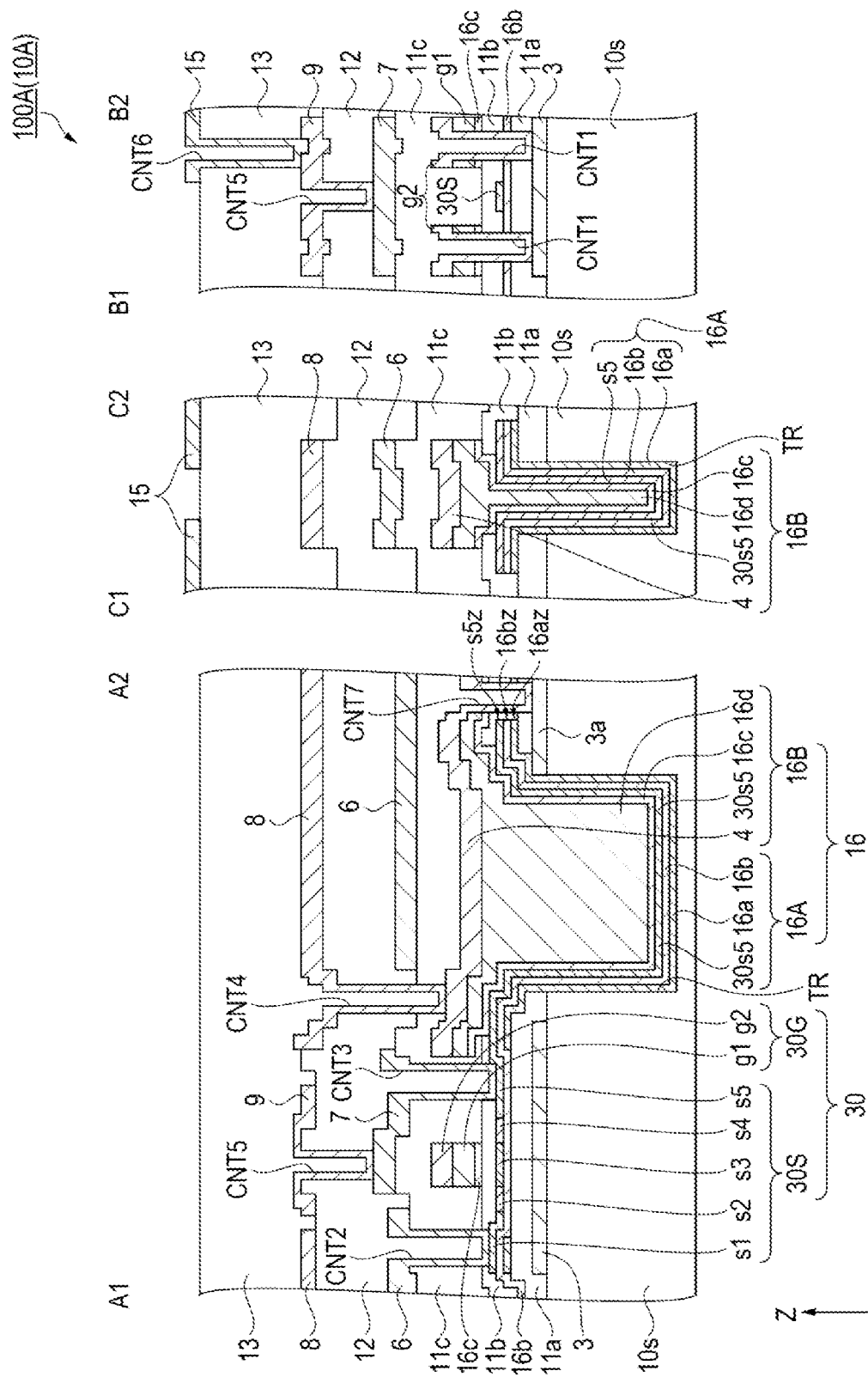
FIG. 35 is a cross-sectional view illustrating a configuration of an element substrate of a modified example.

The present disclosure is not limited to the configuration of the element substrate 10 of the liquid crystal device 100 described above, and a configuration illustrated in FIG. 35 may be adopted. FIG. 35 is a cross-sectional view illustrating a configuration of an element substrate 10A of a liquid crystal device 100A of the modified example. As illustrated in FIG. 35, in the element substrate 10A of the modified example, an end portion 16az of the first capacitance element 16a that constitutes the first capacitance electrode 16A, an end portion 16bz of the first capacitor insulating layer 16b, and an end portion s5z of the other source drain region s5 are formed aligned at the same position. Furthermore, the end portions 16az, 16bz, and s5z are formed extending to a vicinity of the second contact hole CNT7.

According to this configuration, the end portions 16az, 16bz, and s5z of the respective layers constituting the first capacitance element 16A are formed to be aligned, and extending to the vicinity of the second contact hole CNT7, and a larger retention capacitor can be obtained compared to the above-described embodiment. Note that, as a method of aligning and forming the end portions 16az, 16bz, and s5z, the first capacitor insulating layer 16b and the first capacitance electrode 16a can be formed by simultaneously performing etching at timing of patterning the semiconductor layer 30S.

What is claimed is:

1. An electro-optical device, comprising:
a scanning line extending along a first direction;
a data line extending along a second direction intersecting the first direction;
a transistor having a first semiconductor layer including one source drain region and a channel region extending along the first direction, at a position overlapping the scanning line in plan view, and another source drain region extending along the second direction, at a position overlapping the data line in plan view;
a substrate having a recessed portion at the position overlapping the data line; and
a first capacitance element and a second capacitance element disposed inside the recessed portion in order from the substrate wherein
the first capacitance element and the second capacitance element are configured to include a part of the first semiconductor layer, and
the channel region of the first semiconductor layer does not overlap with the data line and the recessed portion in plan view.

2. The electro-optical device according to claim 1, wherein
a part of the first capacitance element and a part of the second capacitance element are disposed along a side surface and a bottom surface of the recessed portion.

3. The electro-optical device according to claim 1, wherein
a part of the first semiconductor layer is injected with an impurity, and functions as a common capacitance electrode of the first capacitance element and the second capacitance element.

4. The electro-optical device according to claim 3, wherein
the first capacitance element is configured to include a first capacitance electrode, a first capacitor insulating layer, and a second capacitance electrode from the substrate side,
the second capacitance element is configured to include the second capacitance electrode, a second capacitor insulating layer, and a third capacitance electrode from the substrate side, and
the second capacitance electrode is a part of the first semiconductor layer.

5. The electro-optical device according to claim 4, comprising:
a relay electrode disposed separated from the scanning line, and configured to electrically couple the first capacitance electrode and the third capacitance electrode, wherein
common potential is applied to the first capacitance electrode and the third capacitance electrode, and
the second capacitance electrode is electrically coupled to a pixel electrode.

6. The electro-optical device according to claim 4, wherein
the third capacitance electrode is disposed separated from a gate electrode of the transistor.

7. The electro-optical device according to claim 4, wherein
the first capacitance electrode is constituted by a second semiconductor layer disposed on the substrate side of the first semiconductor layer.

8. The electro-optical device according to claim 1, wherein
the first semiconductor layer is disposed along the scanning line and the data line.

9. An electronic apparatus, comprising:
the electro-optical device according to claim 1.

10. The electro-optical device according to claim 1, comprising:
another data line adjacent to the data line and extending along the second direction, wherein
the another data line is electrically connected to the one source drain region of the transistor, and
the channel region of the transistor is disposed between the another data line and the data line in plan view.

11. The electro-optical device according to claim 1, wherein
a first dimension of the channel region in the first direction is greater than a second dimension of the channel region in the second direction.

* * * * *